(12) United States Patent
Shim et al.

(10) Patent No.: US 6,462,274 B1
(45) Date of Patent: Oct. 8, 2002

(54) CHIP-SCALE SEMICONDUCTOR PACKAGE OF THE FAN-OUT TYPE AND METHOD OF MANUFACTURING SUCH PACKAGES

(75) Inventors: Il Kwon Shim, Tempe, AZ (US); Chang Kyu Park, KyungKi-Do (KR); Byung Joon Han, Seoul (KR); Vincent DiCaprio, Mesa, AZ (US); Paul Hoffman, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/422,027

(22) Filed: Oct. 20, 1999

(30) Foreign Application Priority Data

| Oct. 31, 1998 | (KR) | 98-46564 |
| Oct. 31, 1998 | (KR) | 98-46567 |
| Oct. 31, 1998 | (KR) | 98-46569 |
| Oct. 31, 1998 | (KR) | 98-46571 |
| Oct. 31, 1998 | (KR) | 98-46574 |

(51) Int. Cl.⁷ .................................................. H01L 23/02
(52) U.S. Cl. .................... 174/52.4; 257/692; 257/780
(58) Field of Search ................ 174/52.4; 257/650, 257/666, 668, 692, 780, 781, 783, 784

(56) References Cited

U.S. PATENT DOCUMENTS

| 4,883,773 A | 11/1989 | Ishikura ..................... 438/3 |
| 5,148,265 A | 9/1992 | Khandros et al. ........... 357/80 |
| 5,258,330 A | 11/1993 | Khandros et al. .......... 439/209 |
| 5,384,689 A | 1/1995 | Shen ........................ 361/761 |
| 5,474,958 A | 12/1995 | Djennas et al. ............ 437/211 |
| 5,477,611 A | 12/1995 | Sweis et al. ................. 29/840 |
| 5,519,936 A | 5/1996 | Andros et al. ............... 29/840 |
| 5,533,256 A | 7/1996 | Call et al. ................... 29/840 |
| 5,536,909 A | 7/1996 | DiStefano et al. ......... 174/261 |
| 5,633,785 A | 5/1997 | Parker et al. ............... 361/766 |
| 5,650,593 A | 7/1997 | McMillan et al. ......... 174/52.4 |
| 5,684,330 A | 11/1997 | Lee ............................. 257/692 |
| 5,753,974 A | 5/1998 | Masukawa .................. 257/737 |
| 5,766,987 A | 6/1998 | Mitchell et al. ............. 438/126 |
| 5,824,177 A | 10/1998 | Yoshihara et al. .......... 156/250 |
| 5,858,815 A | 1/1999 | Heo et al. ................... 438/112 |
| 5,863,813 A | 1/1999 | Dando ........................ 438/114 |
| 5,866,949 A | 2/1999 | Schueller ..................... 257/778 |
| 5,950,070 A | 9/1999 | Razon et al. ................ 438/113 |
| 5,989,982 A | 11/1999 | Yoshihazu ................... 438/462 |
| 5,990,545 A | 11/1999 | Schueller et al. ........... 257/697 |
| 6,025,251 A | 2/2000 | Jakowetz et al. ........... 438/464 |
| 6,028,354 A | 2/2000 | Hoffman ..................... 257/706 |
| 6,043,109 A | 5/2000 | Yang et al. .................. 438/113 |
| 6,072,154 A | 6/2000 | Maynard ..................... 219/209 |
| 6,144,102 A | 11/2000 | Amagai ....................... 257/781 |
| 6,204,091 B1 | 3/2001 | Smith et al. ................. 438/108 |
| 6,252,298 B1 | 6/2001 | Lee et al. .................... 257/668 |

FOREIGN PATENT DOCUMENTS

| EP | WO-98/25303 | 6/1998 | ......... H01L/23/498 |
| JP | 61-214587 | 9/1986 | ........... H01L/33/00 |
| JP | 4-252049 | 9/1992 | ........... H01L/21/78 |
| JP | 4-253359 | 9/1992 | ........... H01L/21/78 |
| JP | 4-254352 | 9/1992 | ........... H01L/21/78 |
| JP | 4-280446 | 10/1992 | ........... H01L/21/66 |

Primary Examiner—Bao Q. Vu
Assistant Examiner—Gary L. Laxton

(57) ABSTRACT

Chip-scale semiconductor packages of the fan-out type and methods of manufacturing such packages are disclosed. In one package embodiment within the invention, the package substrate is stiff enough to effectively carry an increased number of solder balls on an exterior area outside the edge of a semiconductor chip, in addition to the area above the chip. In another package embodiment, a molded support is mounted to the lower surface of the exterior area. The methods of the present invention include making a plurality of packages on a substrate. Prior to sawing a wafer to obtain chips for the assembly method, the wafer is inspected so as to discriminate between good chips and the defective chips. Only good chips are mounted to a wafer-shaped or strip-shaped substrate.

43 Claims, 31 Drawing Sheets

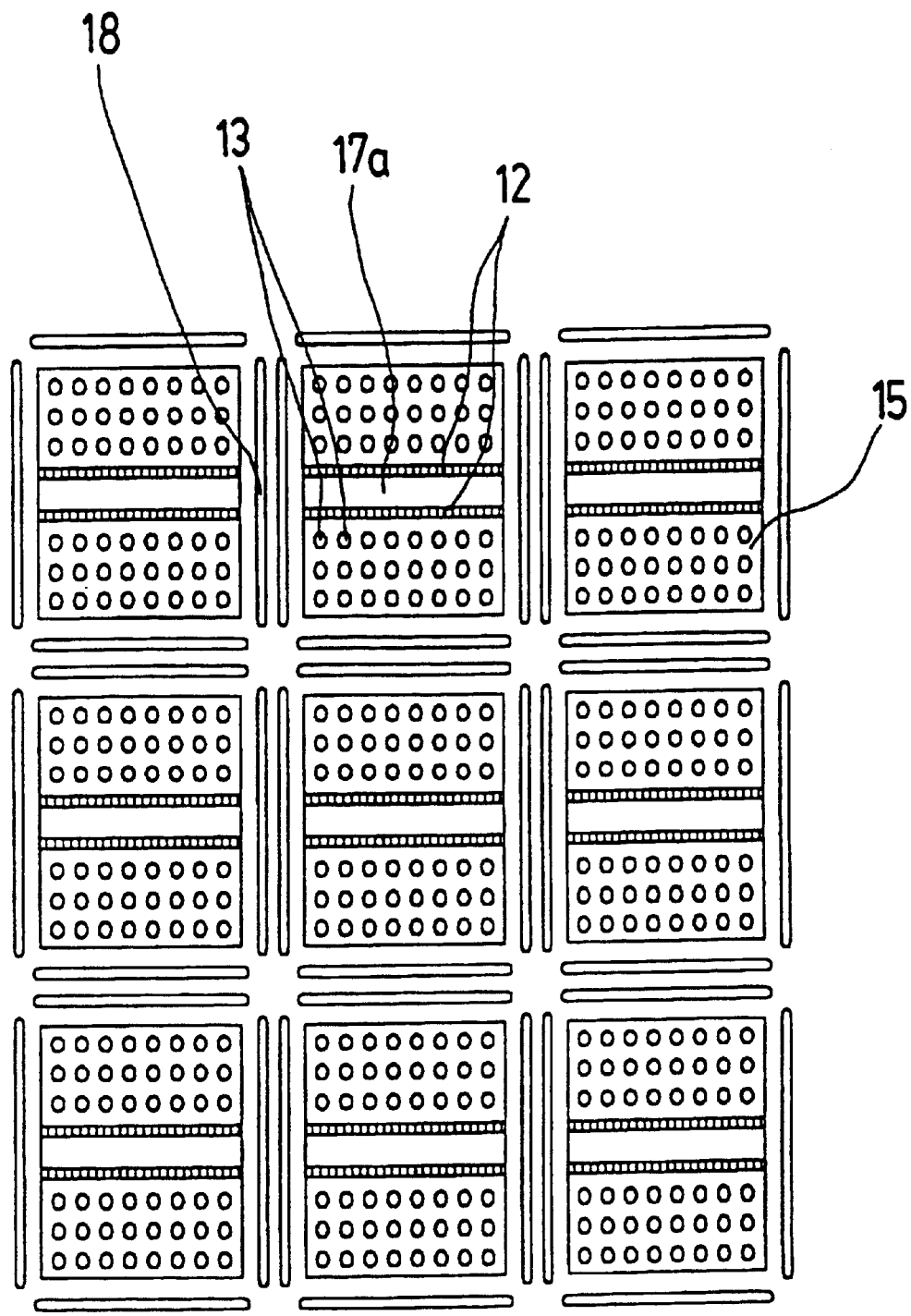

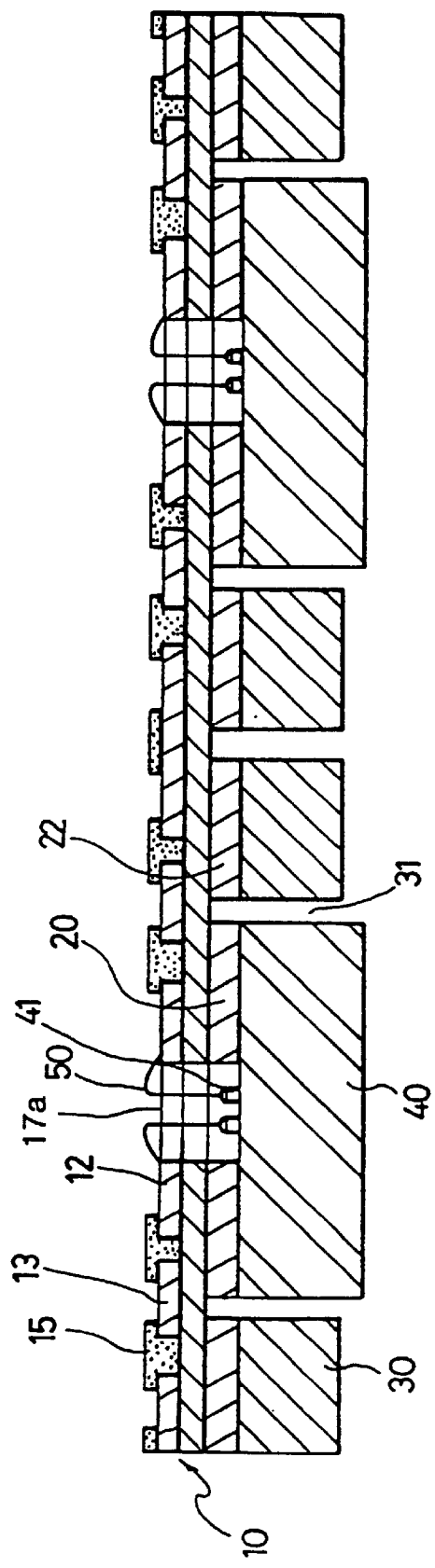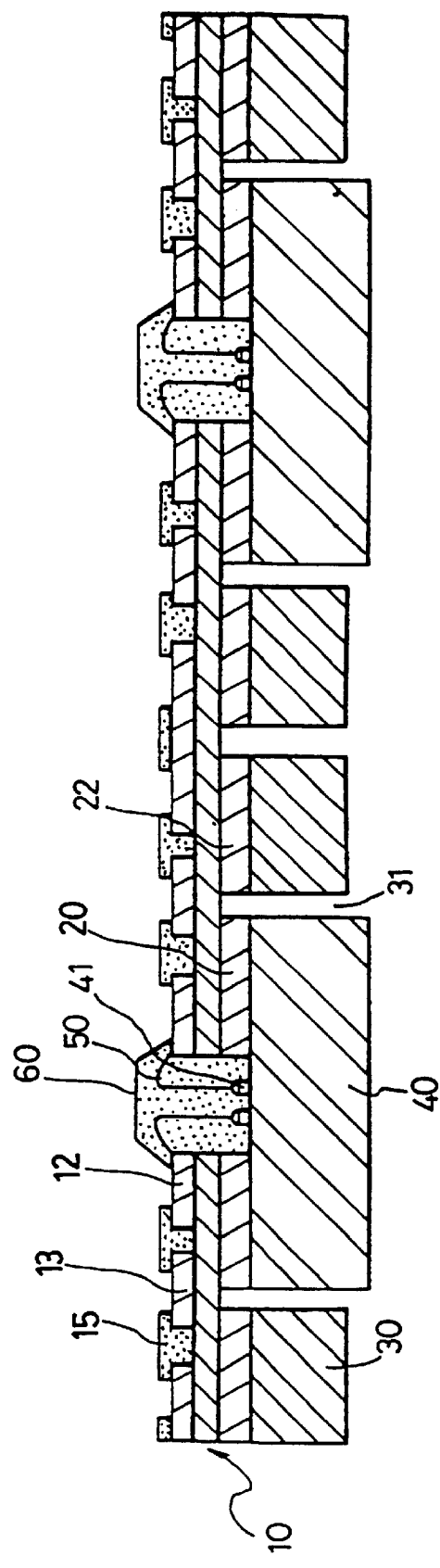

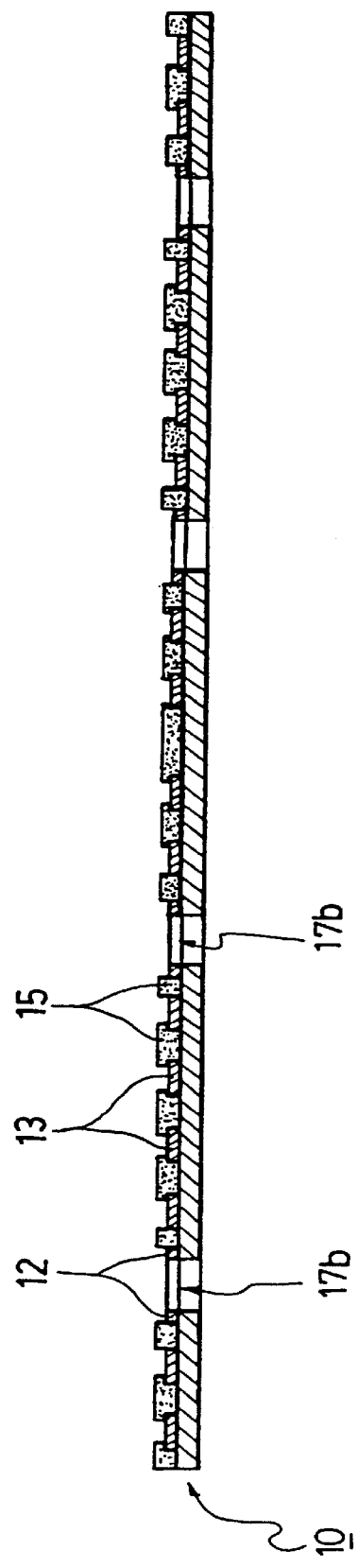
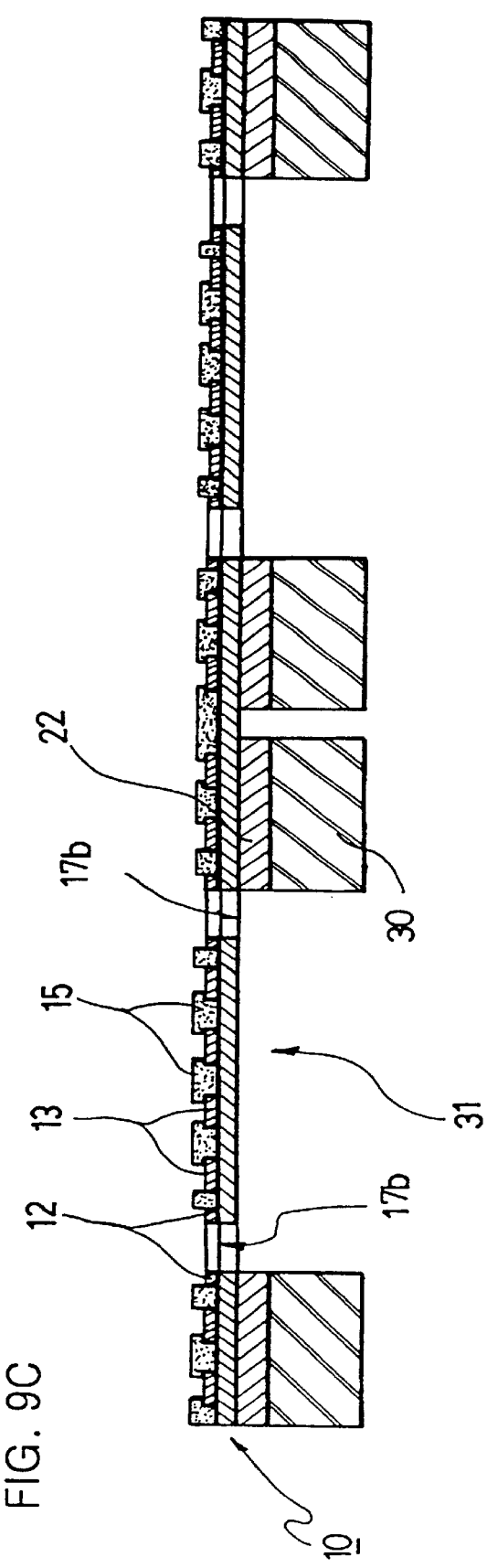

US 6,462,274 B1

CHIP-SCALE SEMICONDUCTOR PACKAGE OF THE FAN-OUT TYPE AND METHOD OF MANUFACTURING SUCH PACKAGES

CROSS-REFERENCE TO RELATED APPLICATION

This application is related to an application entitled "Semiconductor Device And Methods of Manufacturing Such Device" (application Ser. No. 09/422,115) which was filed with the U.S. Patent and Trademark Office on the same day as the present application and is incorporated by reference herein.

FIELD OF THE INVENTION

The present invention relates, in general, to chip-scale semiconductor packages and a method of manufacturing such packages and, more particularly, to a chip-scale semiconductor package of the fan-out type and a method of manufacturing such a package, with solder balls of the package being arranged on an external area of a circuit substrate extending outside the edge of a semiconductor chip in addition to the area of the substrate above the chip, the package thus carrying an increased number of solder balls, or the signal input/output terminals, thereon.

DESCRIPTION OF THE PRIOR ART

As is well known to those skilled in the art, a semiconductor package is a device designed to mount a semiconductor chip on a mother board, in addition to intermediating input/output signals between the chip and the mother board. In accordance with the recent trend of compactness, lightness, thinness and smallness of semiconductor chips, it has been necessary to make such semiconductor packages of a chip size meeting the compactness, lightness, thinness and smallness of the semiconductor chip. Such a chip-sized package is so-called a chip-scale semiconductor package in the art.

FIGS. 11 and 12 show the construction of two types of conventional chip-scale semiconductor packages, respectively.

The package 100' of FIG. 11 is a conventional chip-scale package of the lead type. As shown in the drawing, the chip-scale package 100' of the lead type comprises a semiconductor chip 40', having a plurality of signal input/output pads 41' on its opposite upper edges or along the square edge. Such pads 41' are called "edge pads" in the art. A flexible circuit substrate 10' is attached to the upper surface of the chip 40' by an adhesive layer 21', except for an area around the signal input/output pads 41', with the adhesive layer 21' being uniformly formed between the substrate 10' and the chip 40 within an area of the substrate 10'. The above substrate 10' has a plurality of integrated circuit patterns regularly arranged on its polyimide layer 12'. The above circuit patterns, individually comprising a lead 13', a connector 14' and a solder ball land 15', are electrically connected to the signal input/output pads 41' of the chip 40' at the leads 13', respectively. A cover coat 16' is coated on the top surface of the substrate 10' in a way such that the coat 16' opens for both the leads 13' and the solder ball lands 15' of the circuit patterns. A solder ball 70' is welded to each of the solder ball lands 15' which are exposed through the cover coat 16'. The solder balls 70' are used for mounting the semiconductor package 100' on a mother board and as signal input/output terminals of the package 100'. In order to protect both the pads 41' of the chip 40' and the leads 13' of the circuit patterns from the atmospheric environment, the opposite upper edges or the square upper edge of the chip 40' are individually covered using a packaging material, thus forming a packaging part 60'.

On the other hand, the package 101' of FIG. 12 is a conventional chip-scale package of the wire type. As shown in the drawing, the general shape of the chip-scale package 101' of the wire type remains the same as that described for the lead-type package 100', but the circuit patterns of the substrate 10' of this package 101' do not have leads 13 like the package 100', and are electrically connected to the signal input/output pads 41' of the chip 40' using a-plurality of bonding wires 50' in place of the leads 13'. Further explanation for the-wire-type package 101' is thus not deemed necessary.

In the above-mentioned packages 100' and 101', the signal input/output terminals, or the solder balls 70, are only arranged on a limited area above the top surface of the chip 40'. That is, the solder ball area of each of the packages 100' and 101' is limited, and so such a package 100', 101' is called a package of the "fan-in" type in the art. Therefore, such a chip-scale package 100', 101' of the fan-in type fails to effectively meet the recent trends of compactness and smallness of the semiconductor packages or of a remarkable increase in the number of signal input/output terminals of packages. That is, since the solder ball area of the package of the fan-in type is limited, it is almost impossible for such a package to carry a desired number of solder balls within the limited solder ball area. This finally limits the designing flexibility of the chip-scale semiconductor packages.

In an effort to solve the above-mentioned problem, the outside edge of the substrate 10' may be designed to further extend outwardly until the substrate 10' exceeds the edge of the chip 40, thus forming an exterior area for carrying additional solder balls 70' thereon. However, since a flexible substrate 10' is used in the conventional packages 100' and 101' as described above, such an exterior area of the substrate 10', exceeding the edge of the chip 40', may be bent downwardly. In such a case, it is almost impossible to weld any solder ball 70' to a solder ball land 15' provided on the exterior area of the substrate 10'. Even if a solder ball 70' is welded to a solder ball land 15' on such an exterior area of the substrate 10' with difficulty, the solder balls 70' of a package 100', 101' may fail to accomplish a desired horizontally since the flexible substrate 10 is bent at said exterior area.

In the chip-scale package 100' of the lead type shown in FIG. 11, the leads of the circuit substrate are directly bonded to the signal input/output pads or the edge pads of the semiconductor chip through a tape automated bonding process. However, an excessive bonding force is applied to the semiconductor chip during such a tape automated bonding process, thus sometimes damaging or breaking the chip. In addition, the leads of the substrate of the above package 100' are designed to be thick and wide. Such thick and wide leads regrettably limit the designing flexibility of the remaining parts of the circuit patterns, or the connectors 14' and the solder ball lands 15', of the packages 100'.

The above-mentioned semiconductor packages 100' and 101' may be produced as follows. In order to produce such a package 100', 101', a wafer-shaped circuit substrate is primarily prepared. Thereafter, the wafer-shaped substrate is attached to a wafer, having a plurality of semiconductor chip units, using an-adhesive layer. This step is so-called a wafer lamination step in the art. After the wafer lamination step is accomplished, a wire/lead bonding step is performed. In the wire/lead bonding step, each signal input/output pad of each of the semiconductor chip units of the wafer is electrically connected to an associated bond finger of the substrate through a bonding process using a lead or a wire. The lead/wire bonding step is followed by a packaging step wherein the opposite upper edges or a square upper edge of each of the semiconductor chip units are individually packaged with a packaging part. The objective of the above packaging part is to protect the lead/wire bonding part, comprising the signal input/output pads and the leads or wires, from the atmospheric environment. Thereafter, a solder ball welding step, wherein a plurality of solder balls, or the signal input/output terminals of a package, are welded to the solder ball lands of the substrate, is performed. A singulation step follows the solder ball welding step. In the singulation steps the wafer-shaped substrate, integrated with the semiconductor chip units, is divided-into a plurality of semiconductor packages through a sawing process.

However, the above-mentioned method of manufacturing the chip-scale packages is problematic as follows. That is, the method produces the semiconductor packages through a wafer batch process wherein a wafer, having a plurality of chip units, is attached to a wafer-shaped substrate prior to orderly and continuously performing a lead/wire bonding step, a solder ball welding step, a packaging step, and a singulation step. In such a wafer batch process, there is no means for picking out defective chip units from the wafer prior to attaching the wafer to the substrate. Therefore, the expensive substrate, having a good quality, is regrettably wasted due to such defective chip units occupying a substantial area of the substrate in the same manner as occupied by good chip units. The conventional method of manufacturing the chip-scale packages thus results in a low production yield, reduces the productivity of the packages, and increases the manufacturing cost of the packages.

Another problem, experienced in the conventional chip-scale semiconductor packages, resides in that the packages fail to effectively dissipate heat from the semiconductor chip into the atmosphere during an operation of a package. That is, in accordance with the recent trend of high integration degree and high operational frequency of semiconductor chips, each semiconductor chip emits a large quantity of heat during an operation of a semiconductor package. However, the conventional chip-scale semiconductor packages are not designed to effectively dissipate such heat to the atmosphere, thus being reduced in electric performance and causing an operational error of the chip. This may finally reduce the operational reliability of electronic equipment using such packages. In the conventional chip-scale semiconductor packages, an interfacial separation may be formed at the junction between the parts of a package, thus sometimes undesirably separating the parts from each other or forming a crack on the chip.

SUMMARY OF THE INVENTION

Accordingly, the present invention has been made keeping in mind the above problems occurring in the prior art, and a primary object of the present invention is to provide a chip-scale semiconductor package of the fan-out type, which has a simple construction with the circuit substrate being designed to be stiff enough to effectively carry an increased number of solder balls, or the signal input/output terminals of the package, on its exterior area outside the edge of a semiconductor chip in addition to the area above the chip, and which thus accomplishes the recent trend of compactness, smallness, high integration degree and high operational frequency of semiconductor chips.

It is a second object of the present invention to provide a chip-scale semiconductor package of the fan-out type, of which the circuit substrate is made of a stiff or flexible material and extends outside the edge of the chip, thus forming an exterior area, with a. desired stiffness of the exterior area of the substrate being accomplished by a packaging part molded at a portion defined by the lower surface of said exterior area and the sidewall of the chip, and which thus effectively carries an increased number of solder balls and accomplishes the recent trend of compactness, smallness, high integration degree and high operational frequency of semiconductor chips.

It is a third object of the present invention to provide a chip-scale semiconductor package of the fan-out type, of which the circuit substrate is made of a stiff or flexible material and extends outside the edge of the chip, thus forming an exterior area, with a desired stiffness of the exterior area of the substrate being accomplished by a stiffener attached to the lower surface of said exterior area, thus effectively carrying an increased number of solder balls and accomplishing the recent trend of compactness, smallness, high integration degree and high operational frequency of semiconductor chips, and which also effectively dissipates heat from the chip to the atmosphere and protects the chip from unexpected external impact.

It is a fourth object of the present invention to provide a chip-scale semiconductor package of the fan-out type, of which the circuit substrate is made of a stiff or flexible material and extends outside the edge of the chip, thus forming an exterior area, with a desired stiffness of the exterior area of the substrate being accomplished by a stiffener attached to the lower surface of the exterior area of the substrate, thus effectively carrying an increased number of solder balls and accomplishing the recent trend of compactness, smallness, high integration degree and high operational frequency of semiconductor chips, and which also has a heat dissipating and protection lid on the lower surface of the chip, thus effectively dissipating heat from the chip to the atmosphere and protecting the chip from unexpected external impact.

It is a fifth object of the present invention to provide a method of manufacturing a chip-scale semiconductor package of the fan-out type, in which good quality chip units are picked out from a wafer by sawing the wafer and are attached to the lower surface of a wafer-shaped or strip-shaped circuit substrate prior to performing next steps, and which thus almost completely prevents defective chip units from being attached to the substrate, thereby improving production yield of the packages and reducing the manufacturing cost of the packages.

BRIEF DESCRIPTION OF THE DRAWINGS

The above and other objects, features and other advantages of the present invention will be more clearly understood from the following detailed description taken in conjunction with the accompanying drawings, in which:

FIG. 6 is a plan view of a wafer-shaped substrate designed to have a strip-shaped opening at the center of each unit so as to be used in a semiconductor package of this invention;

FIGS. 8A to 8I are cross-sectional side or perspective views, showing the process of manufacturing a semiconductor package of the third embodiment of this invention;

FIGS. 9A to 9H are cross-sectional side or perspective views, showing the process of manufacturing another semiconductor package of the third embodiment of this invention.

DESCRIPTION OF THE PREFERRED EMBODIMENTS

Figure 1A:
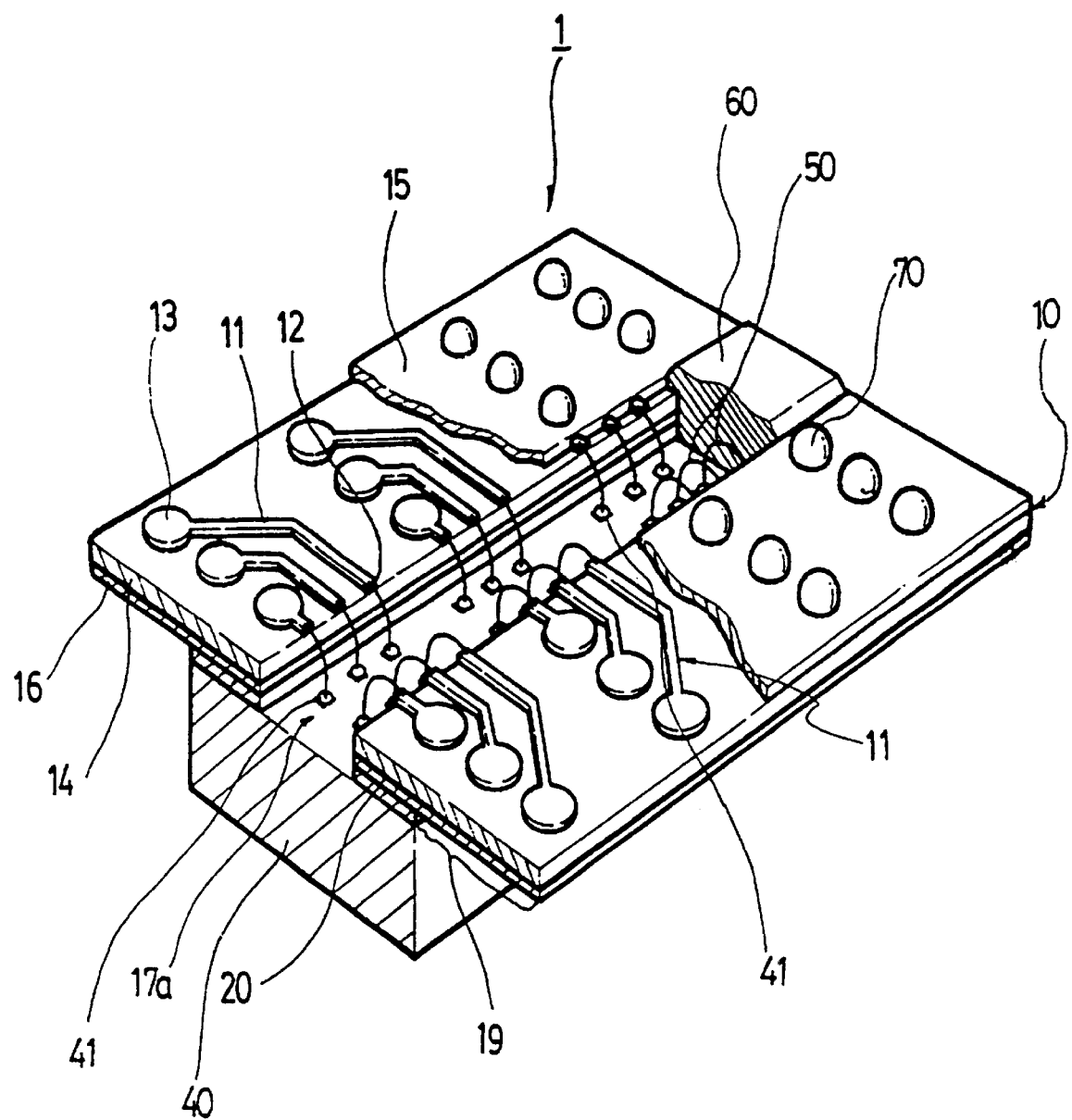
FIG. 1A is a partially broken perspective view, showing the construction of a chip-scale semiconductor package of the fan-out type in accordance with the primary embodiment of this invention, with both a semiconductor chip having a plurality of center pads and a substrate being stiffened by its stiff core layer without having any separate stiffening means.

FIG. 1A is a partially broken perspective view, showing the construction-of a chip-scale semiconductor package 1 of the fan-out type in accordance with the primary embodiment of this invention. The package 1 of FIG. 1A uses a semiconductor chip 40 having a plurality of center pads 41, with a substrate 10 of the package 1 being stiffened by a stiff core layer 16 without having any separate stiffening means.

In the above package 1, the substrate 10 comprises a stiff core layer 16, an insulating flexible polyimide layer 14, a conductive trace 11 and a cover coat 15 which are orderly layered from the bottom to the top of the substrate 10. Due to the stiff core layer 16, the substrate 10 has a stiff structure. A strip-shaped opening 17a is formed at the central portion of the substrate 10 as best seen in FIG. 6, and so the center pads 41 of the chip 40 are positioned within the opening 17a when the substrate 10 is laid on the top of the chip 40. The conductive trace 11 comprises a solder ball land 13 with a bond finger 12 extending from the land 13 to a position around the edge of the opening 17a. A solder ball, or the signal input/output terminal of the package 1, is welded to each solder ball land 13, while a wire 50 is bonded to the bond finger 13.

The above cover coat 15 is coated on the substrate 10 except for an area including the solder ball lands 15 and the bond fingers 12.

In a detailed description of the construction of the package 1, the semiconductor chip 40 has a plurality of center pads 41 which are arranged in a strip-shaped arrangement at the central portion of the chip 40. The substrate 1o is supported by the stiff core layer 16, thus accomplishing a desired stiffness, and is attached to the top surface of the chip 40 using an adhesive layer 20. The above substrate 10 extends to a position outside the edge of the chip 40, thus having an exterior area 19. Each of the pads 41 of the chip 40 is electrically connected to the substrate 10 using a highly conductive wire, such as a gold or aluminum wire. A main packaging part 60 is formed at the strip-shaped opening 17a of the substrate 10 through a molding process so as to protect the wires 50, the pads 41 and-the bond fingers 12 from the atmospheric environment. A solder ball, or the signal. input/output terminal of the package 1, is welded to each solder ball land 13 which is exposed to the outside of the substrate 10.

Due to the stiff core layer 16, the exterior area 19 of the substrate 19 accomplishes a desired stiffness without being supported by any separate stiffening means, such as a separate stiffener or another packaging part. Therefore, it is possible for the exterior area 19 of the substrate 10 to maintain its stiffness without being undesirably bent during a solder ball welding step of a package producing process.

In the primary embodiment of FIG. 1A, the adhesive layer 20 is not formed on the lower surface of the exterior area 19 of the substrate 10. However, it should be understood that the adhesive layer 20 may be formed on the lower surface of said exterior area 19. In addition, the height of the packaging part 60, formed at the opening 17a of the substrate 10, is preferably lower than that of each solder ball 70. In the present invention, it is possible to form the packaging part 60 using a transfer molding epoxy resin or a dispensing liquid epoxy resin through a molding process.

In an operation of the above semiconductor package 1, a signal from the chip 40 is outputted from the center pads 41 and flows through the conductive wires 50, the bond fingers 12, the solder ball lands 13 and the solder balls 70 in order, prior to being transmitted to a mother board (not shown).

Figure 1B:
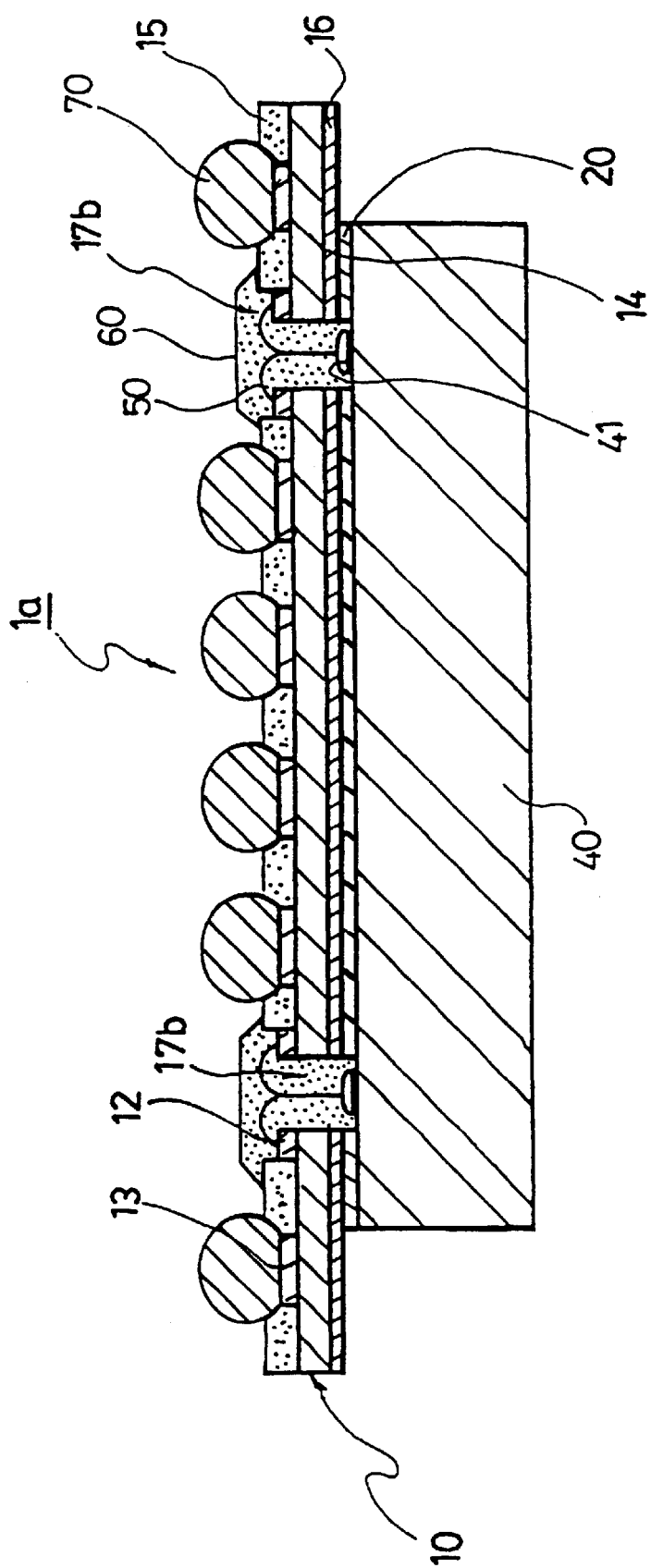
FIG. 1B is cross-sectional view, showing the construction of a chip-scale semiconductor package of the fan-out type in accordance with an alteration of the primary embodiment of this invention, with both a semiconductor chip having a plurality of edge pads and a substrate being stiffened by its stiff core layer without having any separate stiffening means.

FIG. 1B is a cross-sectional side view, showing the construction of a chip-scale semiconductor package 1a of the fan-out type in accordance with an alteration of the primary embodiment of this invention. The package 1a of FIG. 1B uses a semiconductor chip 40 having a plurality of edge pads 41, with the substrate 10 of the package 1a being stiffened by its stiff core layer 16 without having any separate stiffening means.

Figure 10:
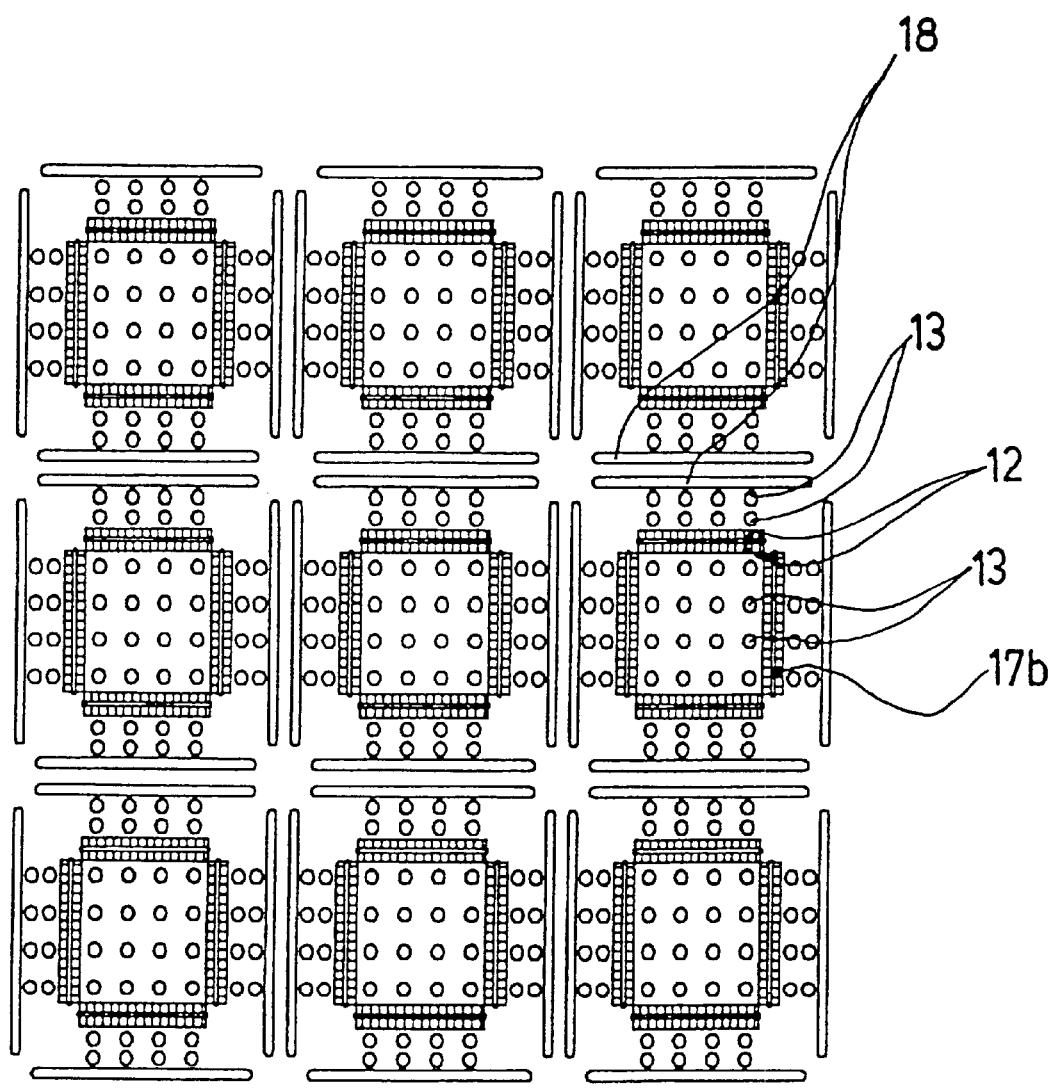
FIG. 10 is a plan view of a wafer-shaped substrate designed to have. a strip-shaped opening along the square edge of each unit so as to be used in a semiconductor package of this invention.
Figure 11:
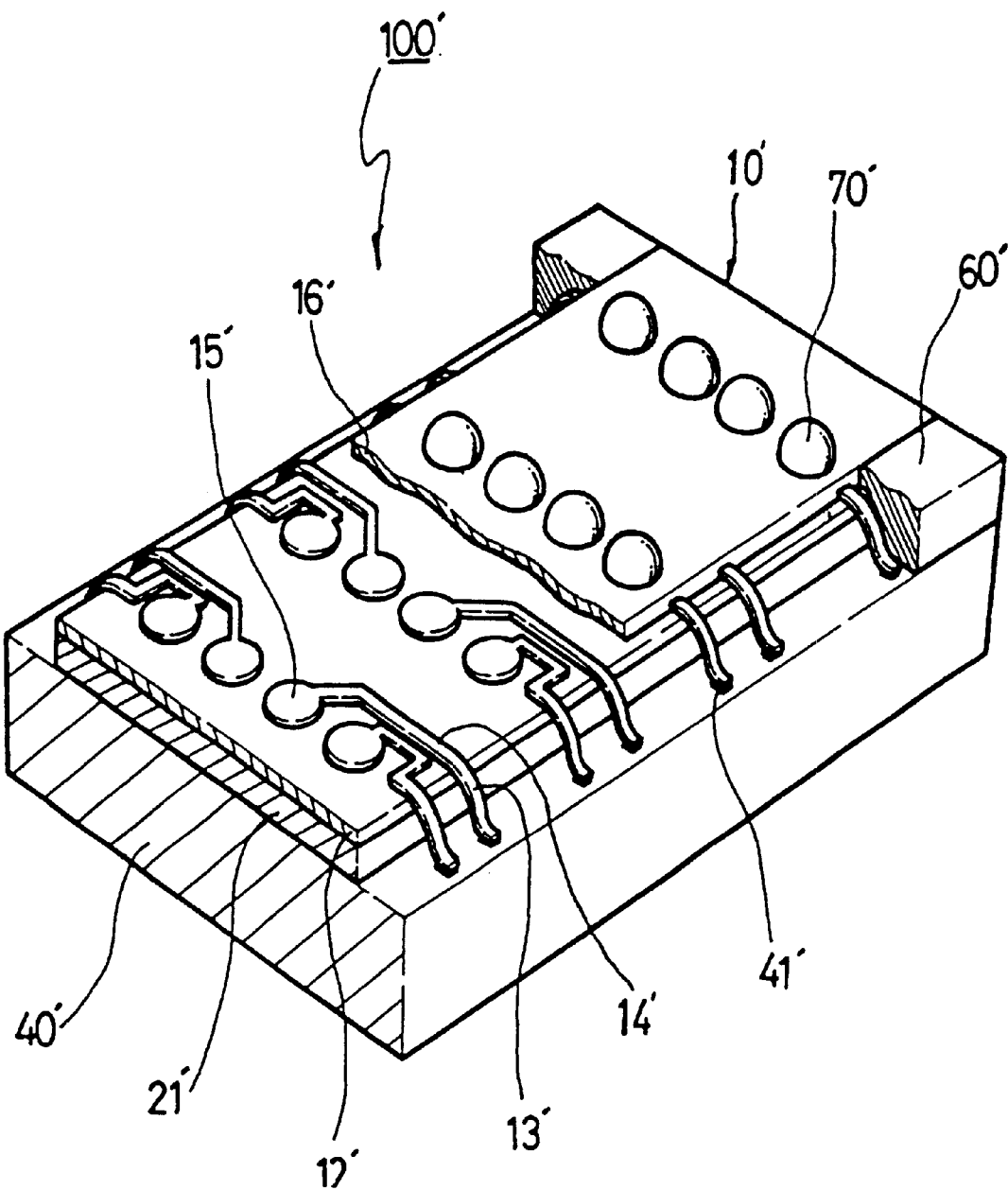
FIGS. 11 and 12 are partially broken perspective views, showing the construction of conventional chip-scale semiconductor packages of the fan-in type.
Figure 12:
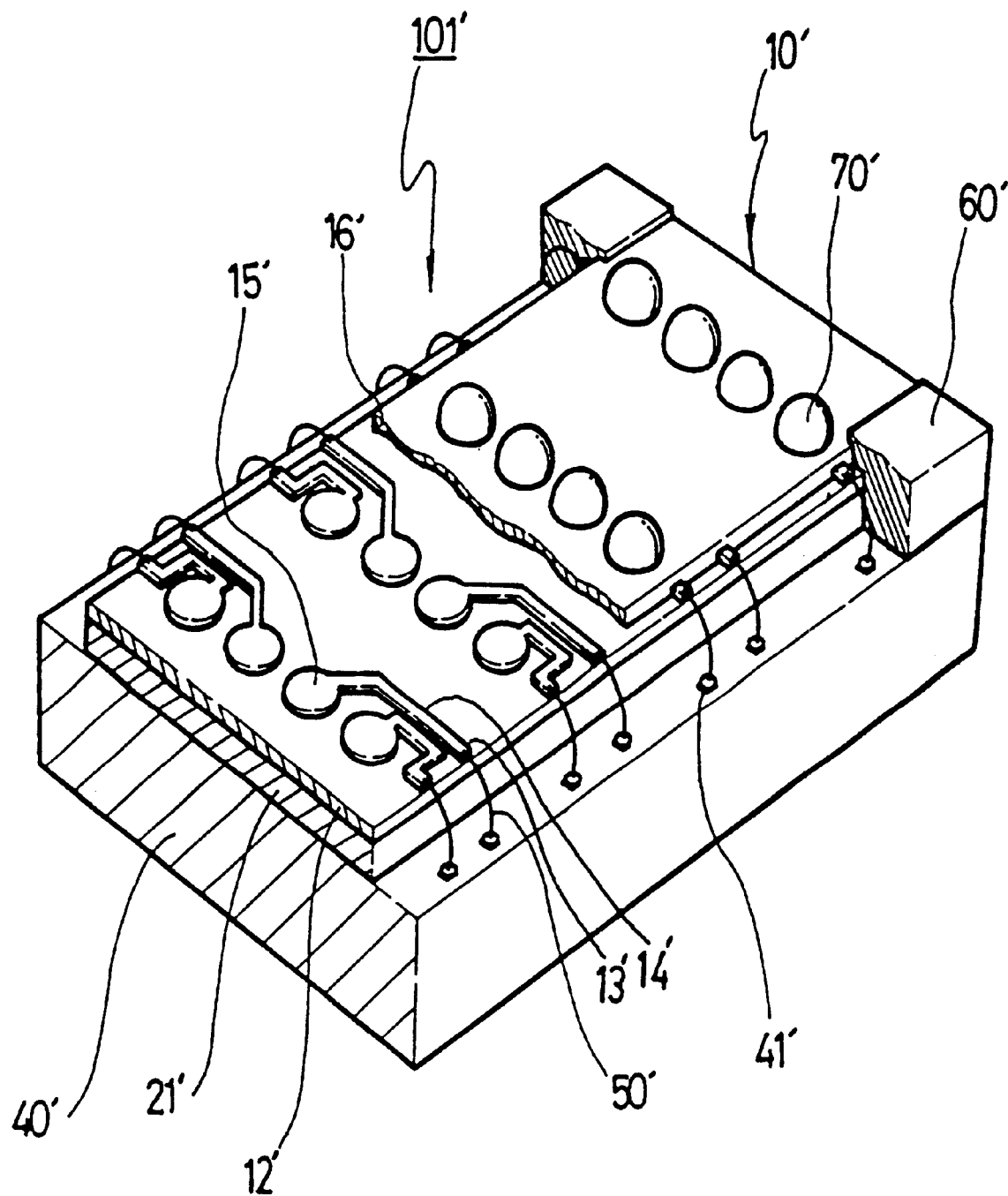

In the package 1a of FIG. 1B, the general shape of the package 1a remains the same as that described for the package 1 of FIG. 1A, but the chip 40 of the package 1a has a plurality of edge pads 41 in place of the center pads of the package 1. Due to the edge pads 41 of the chip 40, the strip-shaped opening 17b of the substrate 10 is positioned and shaped so as to correspond to the edge pads 41 of the chip 40 as best seen in FIG. 10. Further explanation for the construction of the package 1a is thus not deemed necessary.

In accordance with the primary embodiment of this invention, each of the semiconductor packages 1 and 1a has a stiff substrate 10 which extends outside the edge of the chip 40 so as to have a stiff exterior area 19. Due to such a stiff substrate 10, each of the packages 1 and 1a of the primary embodiment effectively carries an increased number of solder balls 70, or the signal input/output terminals of the package, and accomplishes the recent trend of compactness, smallness, high integration degree and high operational frequency of semiconductor chips 40 while being simply designed. In addition, the stiffness of the substrate 10 is accomplished by a stiff-core layer 16, such as a thin metal layer, a glass epoxy layer, or a plastic layer made of the same material as that of a conventional printed circuit board. In such a case, it is preferable to form the thin metal layer using copper or copper alloy. Due to the stiff core layer 16, the exterior area 19 of the substrate 10 is not undesirably bent during a process of manufacturing the package 1, 1a or a process of mounting the package 1, 1a on the surface of a mother board (not shown). The stiff core layer 16 also effectively prevents the edge of the chip 40 from being undesirably bent even though the edge of the chip 40 may be highly stressed during a process of manufacturing the package.

Figure 2A:
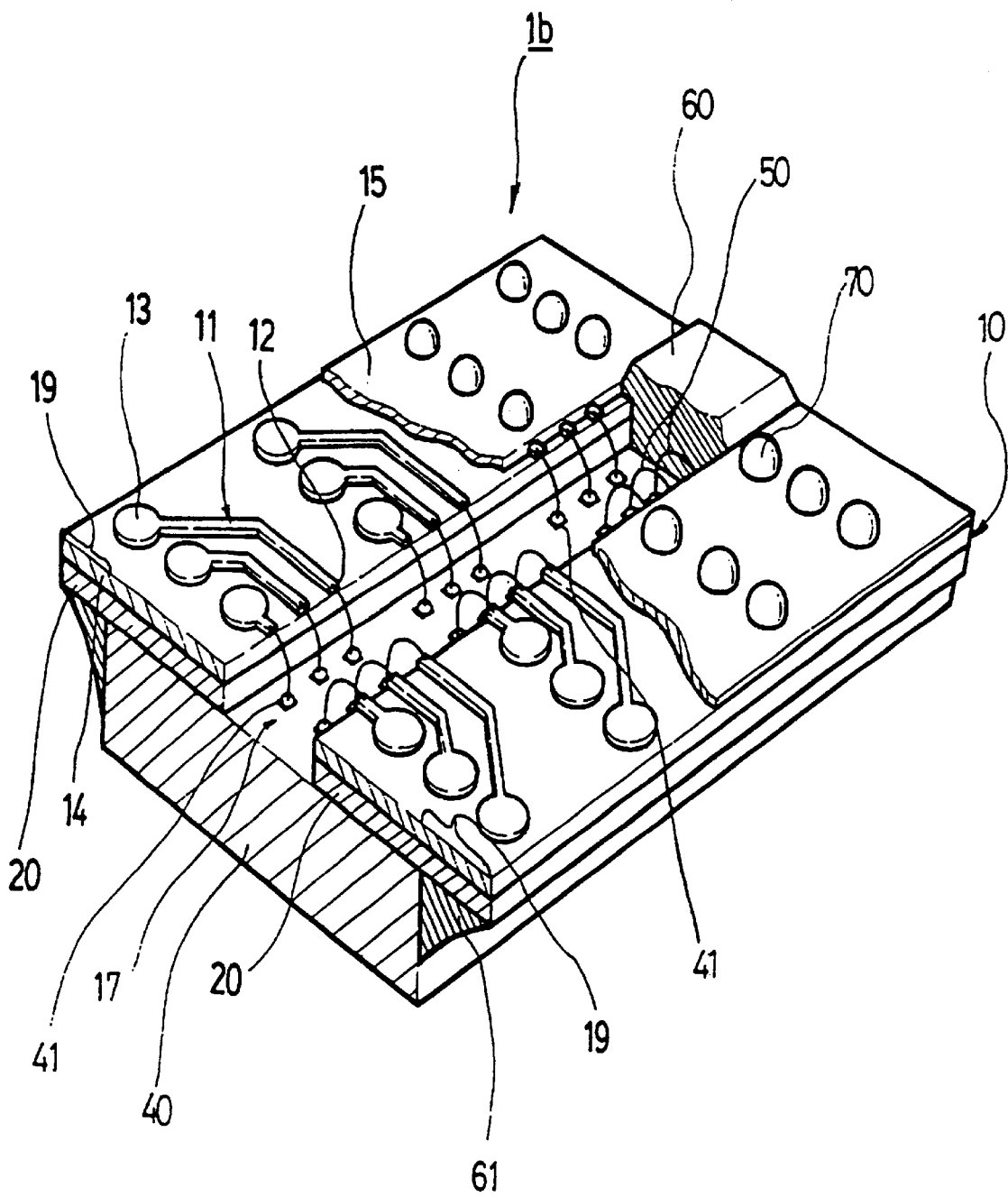
FIG. 2A is a partially broken perspective view, showing the construction of a chip-scale semiconductor package of the fan-out type in accordance with the second embodiment of this invention, with both a semiconductor chip having a plurality of center pads and a substrate being stiffened by an additional packaging part as a separate stiffening means.
Figure 2B:
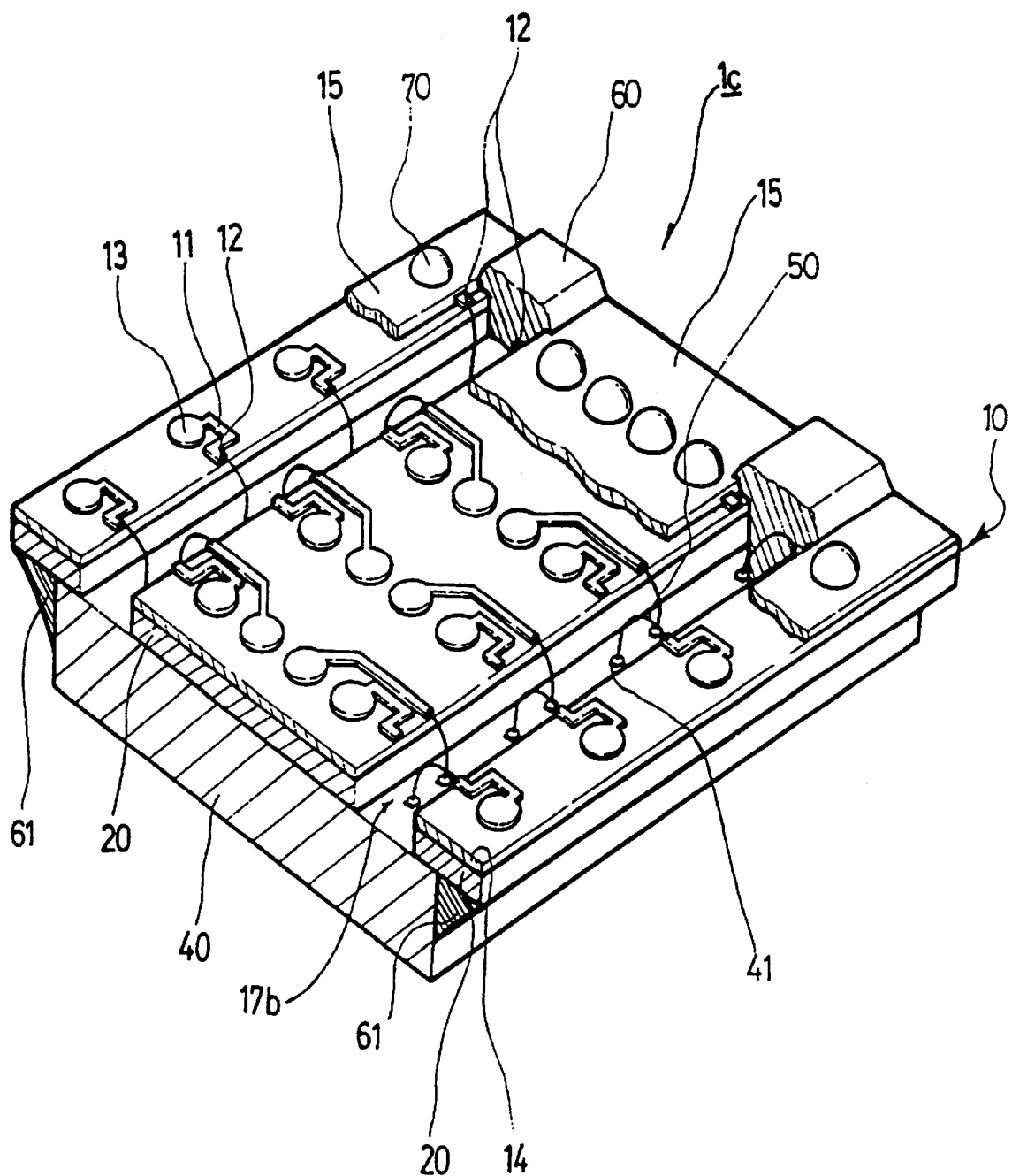
FIG. 2B is a partially broken perspective view, showing the construction of a chip-scale semiconductor package of the fan-out type in accordance with an alteration of the second embodiment of this invention, with both a semiconductor chip having a plurality of edge pads and a substrate being stiffened by an additional packaging part as a separate stiffening means.

FIGS. 2A and 2B are partially broken perspective views, showing the construction of chip-scale semiconductor packages 1b and 1c of the fan-out type in accordance with the second embodiment of this invention, with the packages 1b and 1c individually having an additional packaging part 61 as the means for stiffening the exterior area 19 of the substrate 10. However, the two packages 1b and 1c are different from each other in a way such that the package 1b of FIG. 2A uses a semiconductor chip 40 having a plurality of center pads 41, while the package 1c of FIG. 2B uses a semiconductor chip 40 having a plurality of edge pads 41. Of course, it should be understood that the arrangement of the pads 41 in the package of the second embodiment is not limited to the above-mentioned arrangement. That is, the pads 41 of the chip 40 may be arranged along the edge of a rectangle or of a square. In such a case, the substrate 10 is designed to have an opening 17b corresponding to the arrangement of the pads 41 as shown in FIG. 10.

As shown in FIGS. 2A and 2B, the general shape of the packages 1b and 1c according to the second embodiment remains the same as that described for the packages 1 and 1a according to the primary embodiment, but an additional packaging part 61 is formed under the exterior area 19 of the substrate 10 in order to stiffen the area 19. Therefore, further explanation for the elements, common to both the primary and-second embodiments, is thus not deemed necessary.

The substrate 10 for the packages 1b and 1c may be designed to have a stiff structure, consisting of a stiff core layer 16, a flexible polyimide layer 14, a conductive trace 11 and a cover coat 15 which are orderly layered from the bottom to the top of the substrate 10 in the same manner as that described for the packages 1 and 1a of FIGS. 1A and 1B. Alternatively, the substrate 10 may be designed to have a flexible structure, consisting of a flexible polyimide layer 14, a conductive trace 11 and a cover coat 15 which are orderly layered from the bottom to the top of the substrate 10 as shown in FIGS. 2A and 2B. As a further alternative, the substrate 10 may be designed to have a flexible structure, consisting of a conductive trace 11 coated with a cover coat 15 on its top surface, even though this structure is not shown in the accompanying drawings. In the packages 1b and 1c according to the second embodiment of this invention, the substrate 10 may freely select any one of the above-mentioned three structures without affecting the functioning of this invention.

In each of the packages 1b and 1c according to the second embodiment, the lower surface of the exterior area 19 of the substrate 10, extending outside the edge of the chip 40, is firmly supported by the additional packaging part 61 formed through a resin molding process. In such a case, the vertical surface of the additional packaging part 61 is attached to the sidewall of the chip 40, while the horizontal surface is attached to the lower surface of the exterior area 19. Of course, when the adhesive layer 20 is formed on the lower surface of the exterior area 19, the horizontal surface of the additional packaging part 61 is attached to the adhesive layer 20. The outside wall of the packaging part 61 is smoothly curved, thus forming an accurate surface. Of course, it should be understood that the size and configuration of the packaging part 61 may be somewhat freely designed without being critically limited to the above-mentioned conditions.

In the packages 1b and 1c according to the second embodiment, the exterior area 19 of a stiff or flexible substrate 10 is supported by an additional packaging part 61 which is formed on the lower surface of the exterior area 19. Due to such a substrate 10 stiffened by an additional packaging part 61 at its exterior area 19, the package 1b, 1c of the second embodiment effectively carries an increased number of solder balls 70, or the signal input/output terminals of the package, and accomplishes the recent trend of compactness, smallness, high integration degree and high operational frequency of semiconductor chips 40 while being simply designed. The additional packaging part 61 also prevents the exterior area 19 of the substrate 10 from being undesirably bent and stabley supports the solder balls 70 carried on the exterior area 19 of the substrate 10. In the second embodiment, the adhesive layer 20 may be formed on the lower surface of the substrate 10 in a way such that it covers the lower surface of the exterior area 19. Alternatively, the adhesive layer 20 may be formed on the lower surface of the substrate 10 at a limited position except for the exterior area 19.

Figure 3A:
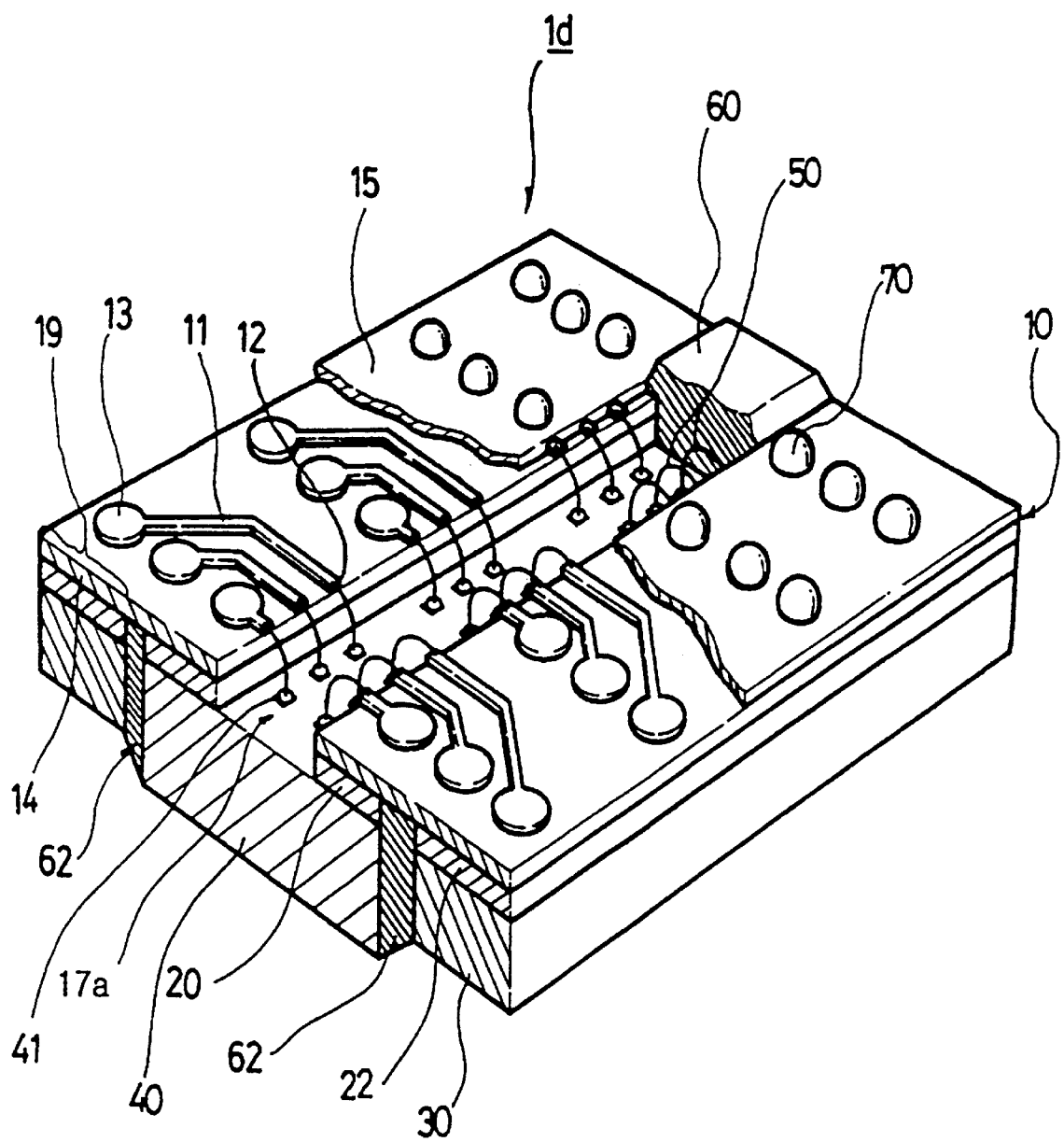
FIG. 3A is a partially broken perspective view, showing the construction of a chip-scale semiconductor package of the fan-out type in accordance with the third embodiment of this invention, with both a semiconductor chip having a plurality of center pads and a substrate being stiffened by a stiffener as a separate stiffening means.
Figure 3B:
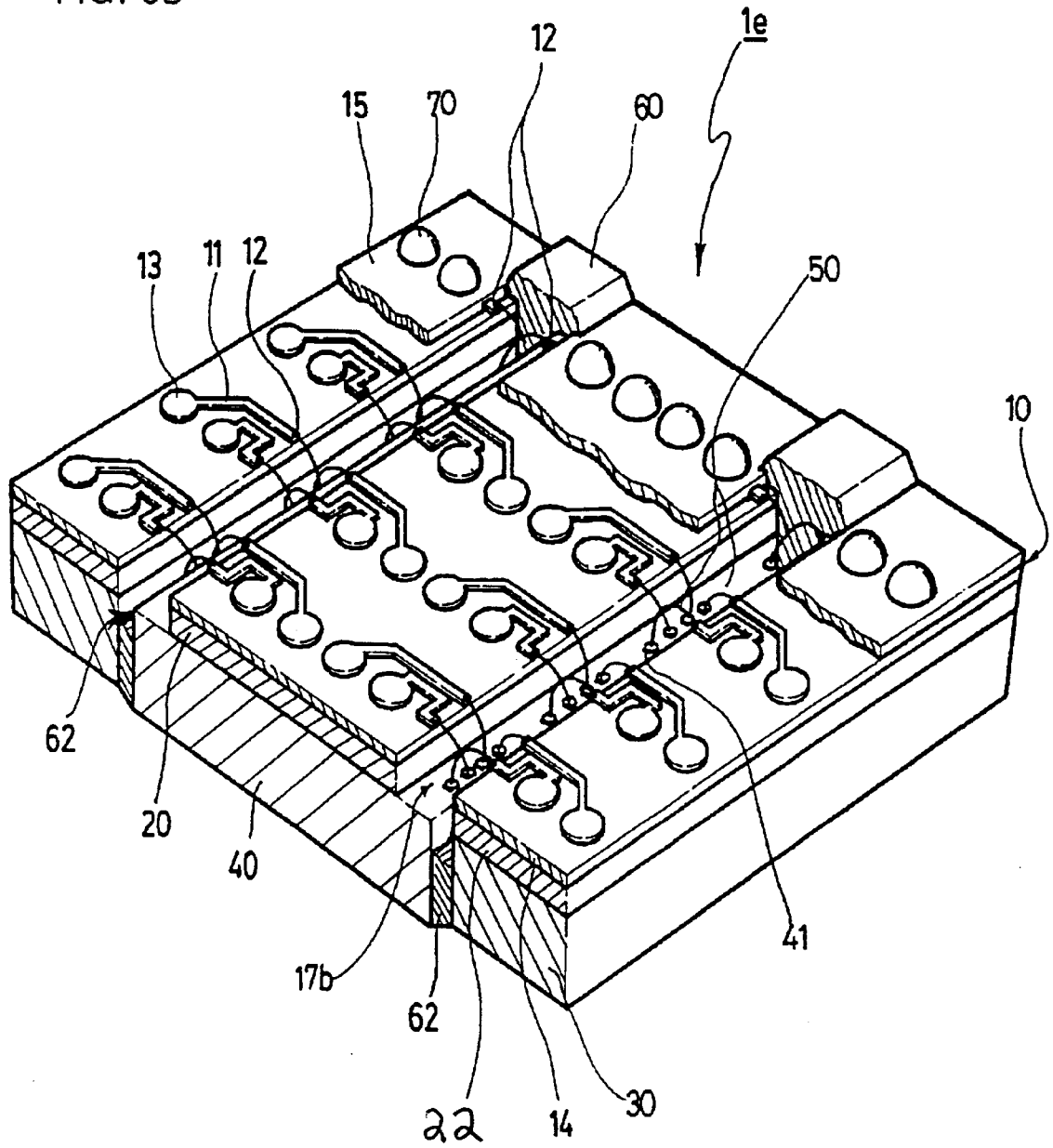
FIG. 3B is a partially broken perspective view, showing the construction of a chip-scale semiconductor package of the fan-out type in accordance with an alteration of the third embodiment of this invention, with both a semiconductor chip having a. plurality of edge pads and a substrate being stiffened by a stiffener as a separate stiffening means.

FIGS. 3A and 3B are partially broken perspective views, showing the construction of chip-scale semiconductor packages 1d and 1e of the fan-out type in accordance with the third embodiment of this invention. In the third embodiment, the general shape of each package 1d, 1e remains the same as that described for the package 1b, 1c of the second. embodiment, but a stiffener 30 in place of the additional packaging part 61 of the second embodiment is formed on the lower surface of the exterior area 19 and is used as the means for stiffening the exterior area 19. Therefore, further explanation for the elements, common to both the second and third embodiments, is thus not deemed necessary.

In the third embodiment, the stiffener 30 is preferably made of a highly conductive material, such as copper, aluminum or an alloy of copper and aluminum, since the material effectively improves the heat dissipating effect of the package 1d, 1e. However, it should be understood that the material of the stiffener 30 is not limited to the above-mentioned materials. That is, the stiffener 30 may be made of a ceramic, a metal powder dispersed resin, or other resins. In addition, the stiffener 30 is preferably shaped into a longitudinal rod shape having a rectangular or square cross-section as shown in FIGS. 3A and 3B. However, the shape of the stiffener 30 is not limited to the above-mentioned design. That is, the stiffener 30 may be designed as an angled ring shape having a rectangular, square or trapezoidal cross-section.

The above stiffener 30 is attached to the lower surface of the exterior area 19, extending outside the edge of the chip 40, using an adhesive layer 22. In the second embodiment, the stiffener 30 is spaced apart from the sidewall of the chip 40, thus forming a gap. The above gap is packaged with an additional packaging part 62 through a molding process as shown in FIGS. 3A and 3B. However, it should be understood that the stiffener 30 may be designed in a way such that it comes into close contact with the sidewall of the chip 40 without leaving any gap between them. In such a case, the package is free from such an additional packaging part 62.

In the package 1d of FIG. 3A, a main packaging part 60 is formed at the strip-shaped opening 17a of the substrate 10 through a molding process so as to protect the wires 50, the pads 41 and the bond fingers 12 from the atmospheric environment. The package 1d also has an additional packaging part 62, formed at the gap between the stiffener 30 and the chip 40 through a molding process. In the above package 1d, the two packaging parts 60 and 62 are separated from each other.

On the other hand, since the package 1e of FIG. 3B has a plurality of edge pads 41 on the chip 40, the two packaging parts 60 and 62 are integrated with each other into a single body.

In the packages 1d and 1e according to the third embodiment of the invention, the exterior area 19 of a stiff or flexible substrate 10, extending outside the edge of the chip 40, is supported and stiffened by a stiffener 30 provided on the lower surface of the exterior area 19. Due to such a substrate 10, the package 1d, 1e of the third embodiment effectively carries an increased number of solder balls 70, or the signal input/output terminals of the package, and accomplishes the recent trend of compactness, smallness, high integration degree and high operational frequency of semiconductor chips 40. The stiffener 30 also improves the heat dissipating effect of the package and protects the chip from external impact.

In the third embodiment, the adhesive layers 20 and 22, used for attaching both the chip 40 and the stiffener 30 to the substrate 10, may be separately formed on associated positions with the intermediate position between the chip 40 and the stiffener 30 being free from any adhesive layer. However, it should be understood that both the chip 40 and the stiffener 30 may be attached to the substrate 10 using one integrated adhesive layer which is formed on most of the lower surface of said substrate 10 except for the openings 17a and 17b. In such a case, a double-faced tape, having the same shaped and sized openings as that of the openings 17a and 17b of the substrate 10 at a position corresponding to the openings 17a and 17b, may be preferably used as the integrated adhesive layer.

FIGS. 4A to 4F are cross-sectional side views, showing the construction of chip-scale semiconductor packages 1f, 1g, 1h, 1i, 1j and 1k of the fan-out type in accordance with six alterations of the fourth embodiment of this invention. In the fourth embodiment, each of the packages has both a stiffener 30 and a lid 80. In each of the packages according to the fourth embodiment, the lid 80 improves the heat dissipating effect of the package and protects the chip 40 from external impact, moisture, or dust.

Figure 4A:
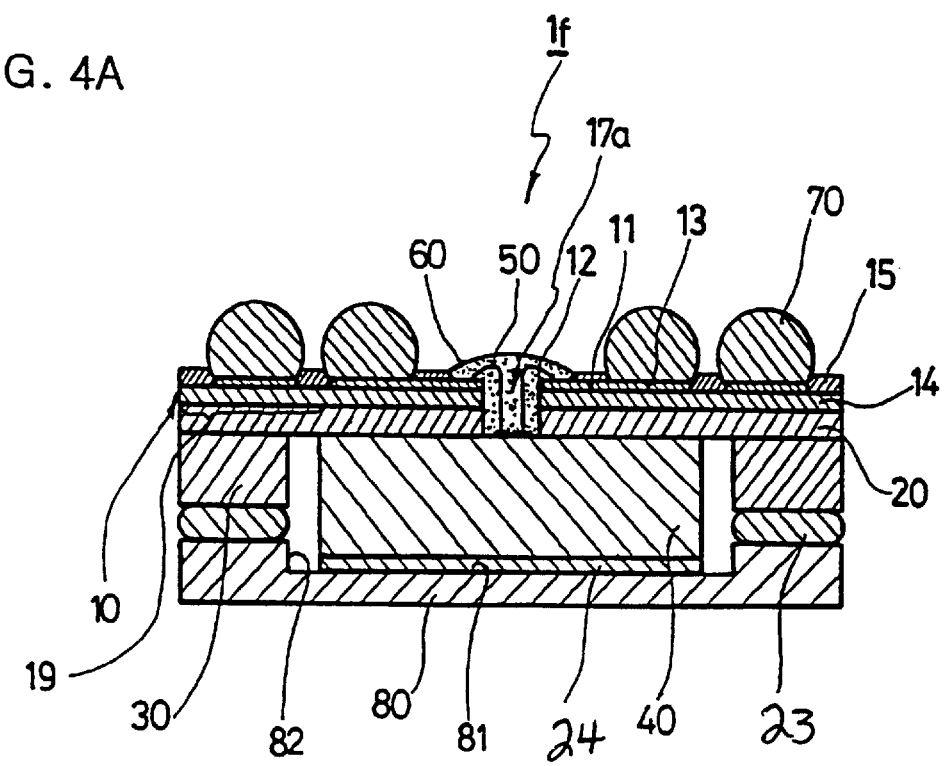
FIGS. 4A to 4F are cross-sectional side views, showing the construction of chip-scale semiconductor packages of the fan-out type in accordance with six alterations of the fourth embodiment of this invention, each of the packages having a stiffener and a lid.
Figure 4B:
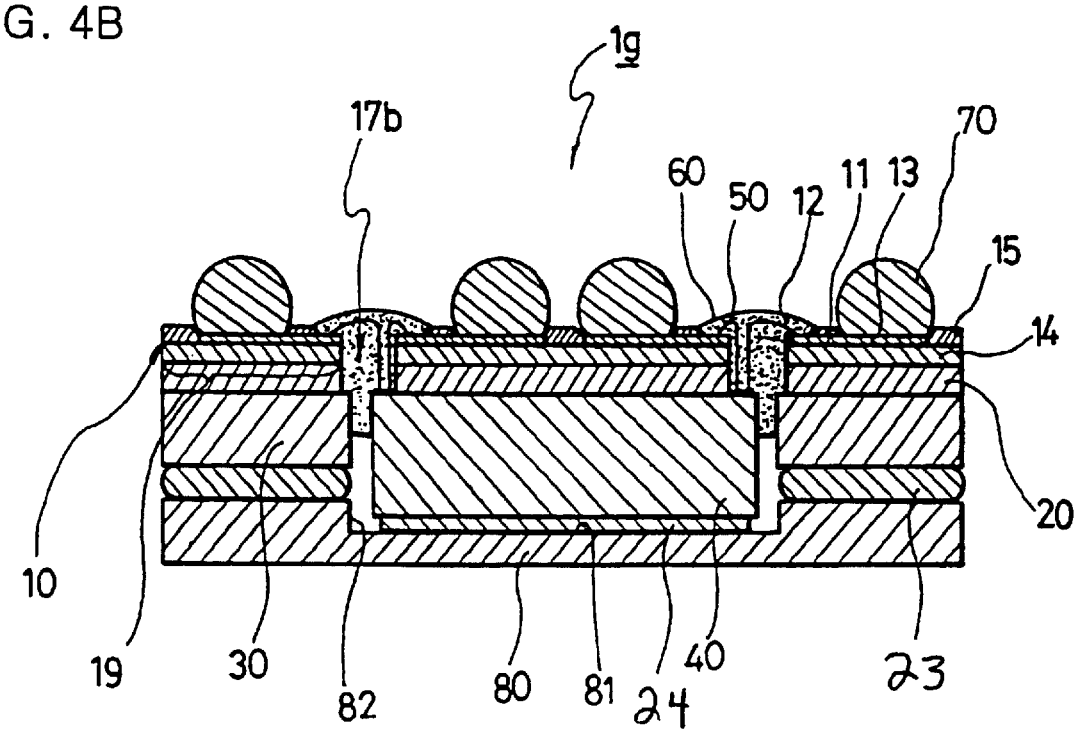
Figure 4C:
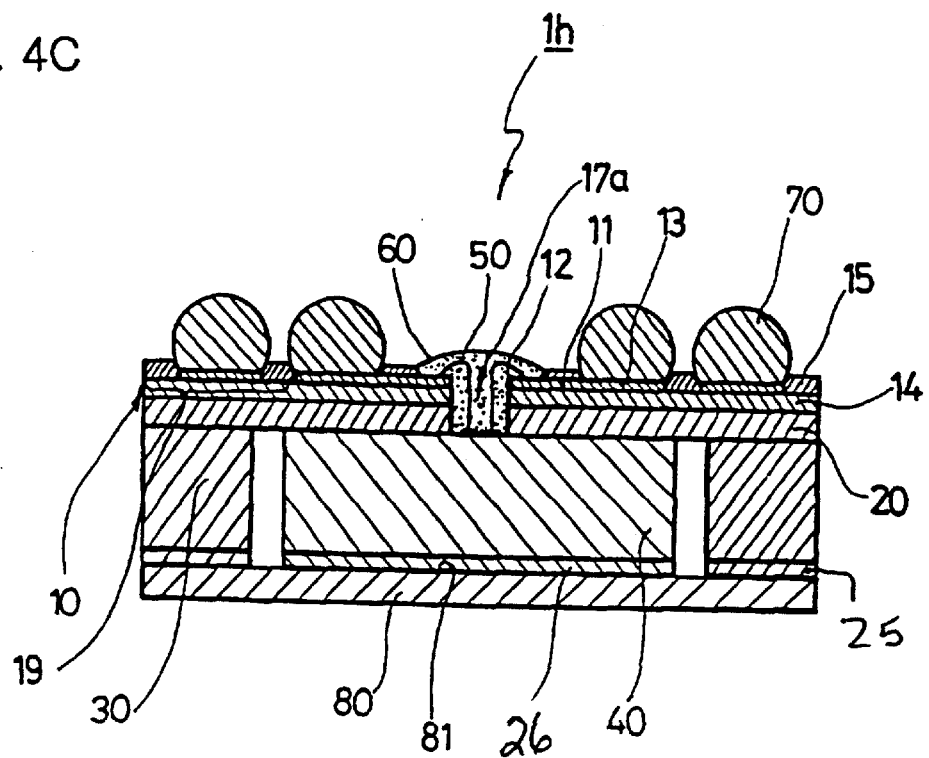
Figure 4D:
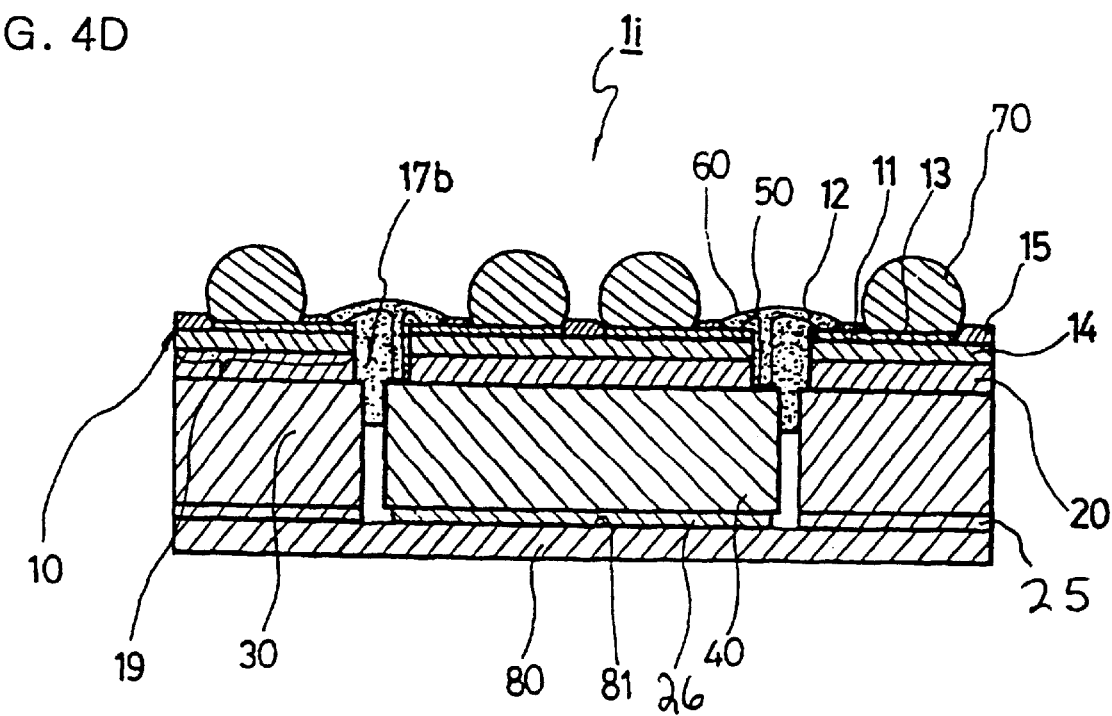
Figure 4E:
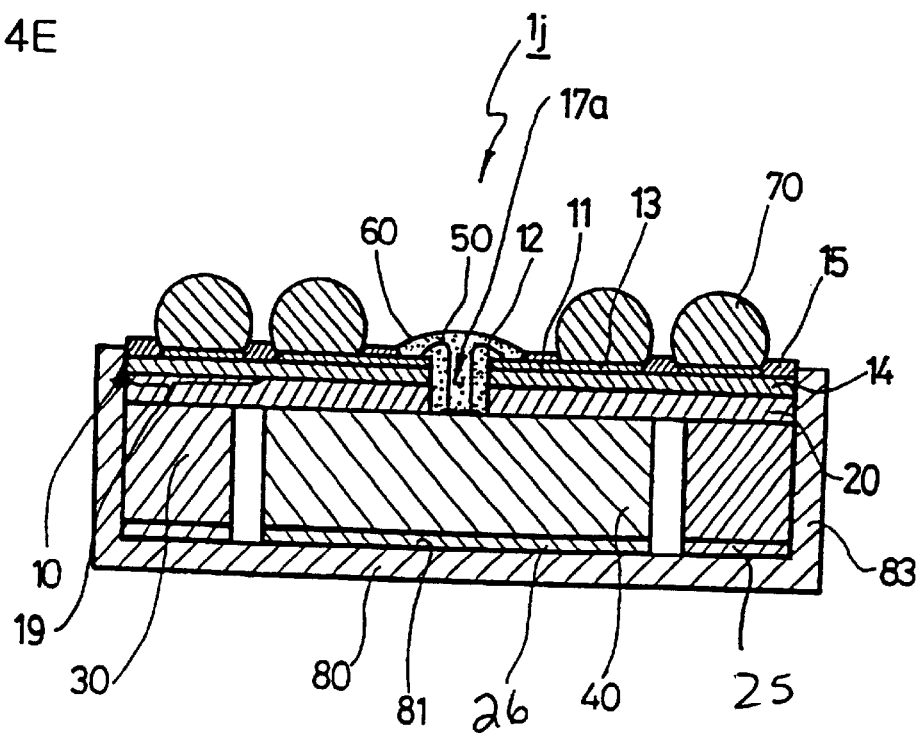

In the packages 1f, 1h and 1j of FIGS. 4A, 4C and 4E, the general shape of each package remains the same as that described for the package 1d of FIG. 3A, but the packages 1f, 1h, 1j are provided with a lid 80 on the bottom different from the package 1d.

That is, in each of the packages 1f, 1h and 1j of FIGS. 4A, 4C and 4E, a plurality of center pads 41 are formed on the chip 40 in a way such that the pads 41 are arranged in a strip-shaped arrangement, while an opening 17a is formed on the substrate 10 at a position corresponding to the pads 41 as shown in FIG. 6. A stiffener 30 is attached to the lower surface of the exterior area 19 of the substrate 10 using an adhesive layer 20.

Figure 4F:
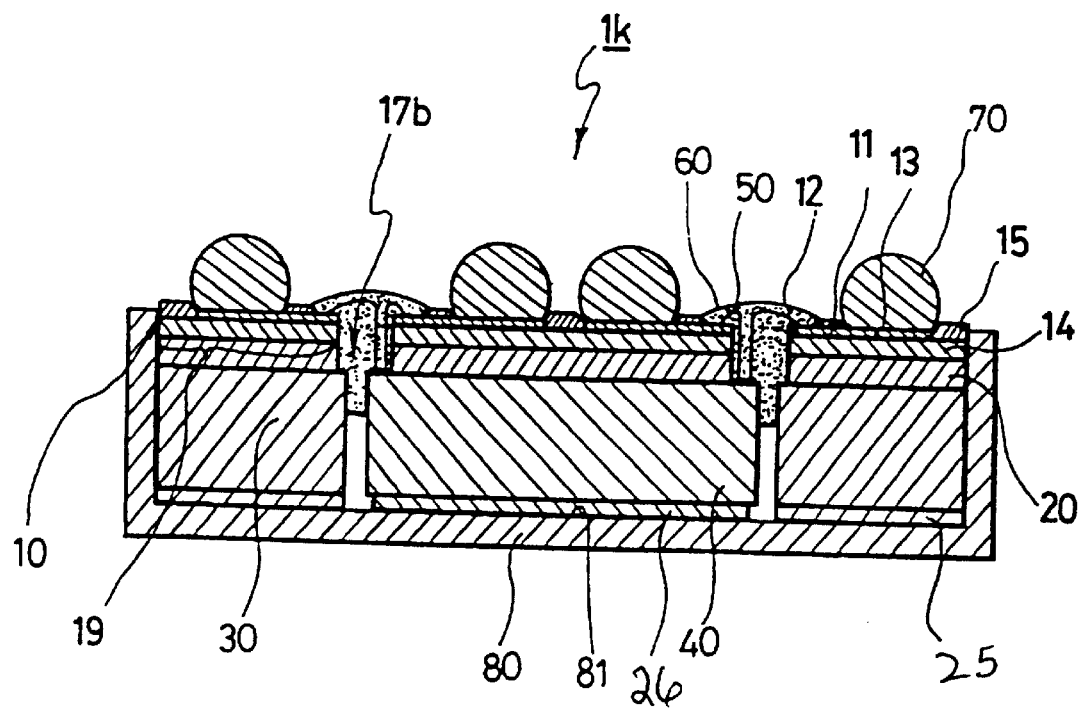

On the other hand, in the packages 1g, 1i and 1k of FIGS. 4B, 4D and 4F, the general shape of each package remains the same as that described for the package 1e of FIG. 3B, but the packages 1g, 1i, 1k are provided with a lid 80 on the bottom different from the package 1e.

That is, in each of the packages 1g, 1i and 1k of FIGS. 4B, 4D and 4F, a plurality of edge pads 41 are formed on the chip 40 in a way such that the pads 41 are arranged along opposite edges, or along the rectangular or square edge of the chip 40, while an opening 17b is formed on the substrate 10 at a position corresponding to the pads 41 as shown in FIG. 10. A stiffener 30 is attached to the lower surface of the exterior area 19 of the substrate 10 using an adhesive layer 20.

In the packages 1f and 1g of FIGS. 4A and 4B, a stiffener 30 is attached to the lower surface of the exterior area 19 of the substrate 10 using an adhesive layer 20 or 22, with the thickness of the stiffener 30 being lower than that of the chip 40. The lid 80 of each of the above packages 1f and 1g has a rectangular or square rim 82 on its top surface. The above lid 80 is attached to the lower surface of the chip 40 at the depressed center portion of its top surface, and is attached to the lower surface of the stiffener 30 at the top surface of the rim 82. In such a case, additional adhesive layers 23 and 24 are used for attaching the lid 80 to both the chip 40 and the stiffener 30.

In the packages 1h and 1i of FIGS. 4C and 4D, a stiffener 30 is attached to the lower surface of the exterior area 19 of the substrate 10 using an adhesive layer 20, with the thickness of the stiffener 30 being almost equal to that of the chip 40. The lid 80 of each of the above packages 1h and 1i has a flat top surface at which the lid 80 is attached to the lower surface of both the chip 40 and the stiffener 30 using an additional adhesive layer 25 and 26.

In the packages 1j and 1k of FIGS. 4E and 4F, a stiffener 30 is attached to the lower surface of the exterior area 19 of the substrate 10 using an adhesive layer 20 or 22, with the thickness of the stiffener 30 being almost equal to that of the chip 40. The lid 80 of each of the above packages 1j and 1k has a rectangular or square sidewall 83 along its edge, and is attached to the lower surface of both the chip 40 and the stiffener 30 using an additional adhesive layer 25 and 26. In such a case, the interior surface of the sidewall of the lid 80 may be attached to the sidewall of the package.

In the packages 1f, 1g, 1h, 1i, 1j and 1k of the fan-out type according to the fourth embodiment of this invention, a cavity is left between the stiffener 30 and the chip 40 as shown in FIGS. 4A to 4F. However, it should be understood that each of the packages. 1f, 1g, 1h, 1i, 1j and 1k may be designed in that the stiffener 30 comes into contact with the sidewall of the chip 40 without leaving any cavity between them. As a further alternative, each of the packages 1f, 1g, 1h, 1i, 1j and 1k may be designed in that a cavity is left between the stiffener 30 and the chip 40 prior to being closely filled with a metal impregnated resin.

In the packages 1f, 1g, 1h, 1i, 1j and 1k according to the fourth embodiment of the invention, the exterior area 19 of a stiff or flexible substrate 10, extending outside the edge of the chip 40, is supported and stiffened by a stiffener 30 provided on the lower surface of the exterior area 19. Due to such a substrate 10, each package 1f, 1g, 1h, 1i, 1j, 1k of the fourth embodiment effectively carries an increased number of solder balls 70, or the signal input/output terminals of the package, and accomplishes the recent trend of compactness, smallness, high integration degree and high operational frequency of semiconductor chips 40. In addition, the package 1f, 1g, 1h, 1i, 1j, 1k of the fourth embodiment is provided with a lid 80, thus having an improved heat dissipating effect and protecting the chip 40 from external impact.

FIGS. 5A to 5G are cross-sectional side views, showing the process of manufacturing the semiconductor package 1 of the primary embodiment of this invention. Of course, it should be understood that the process of manufacturing the semiconductor package 1a of FIG. 1B is equal to that of the package 1.

Figure 5A:
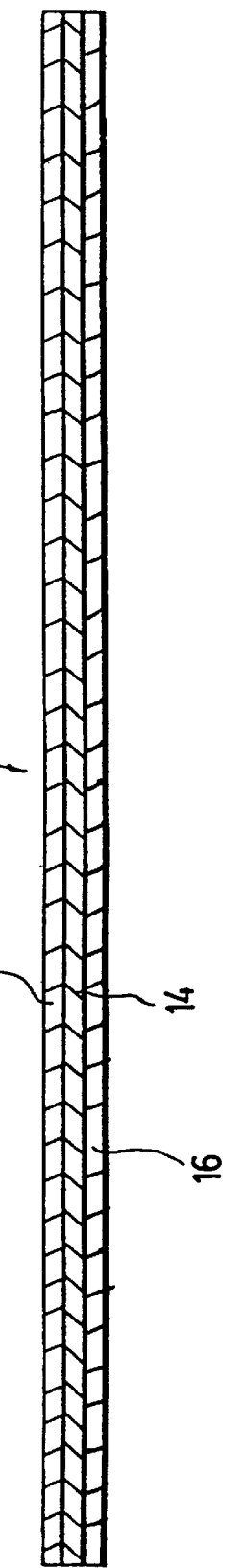
FIGS. 5A to 5G are cross-sectional side views, showing the process of manufacturing a semiconductor package of the primary embodiment of this invention.

As shown in FIG. 5A, a flexible insulating polyimide layer 14 is formed on a strip-shaped stiff core layer 16 having the same size and configuration as that of a conventional wafer. Thereafter, a conductive thin film, preferably a thin copper film 11a, is formed on the polyimide layer 14 through a sputtering process or an adhesion process, with the adhesion process using an adhesive layer, thus forming a raw substrate sheet 10a. This step is so-called a raw substrate sheet forming step. In the above step, the raw substrate sheet 10a may be formed by directly forming the thin copper film 11a on the core layer 16 while being free from such a polyimide layer 14.

Figure 5B:
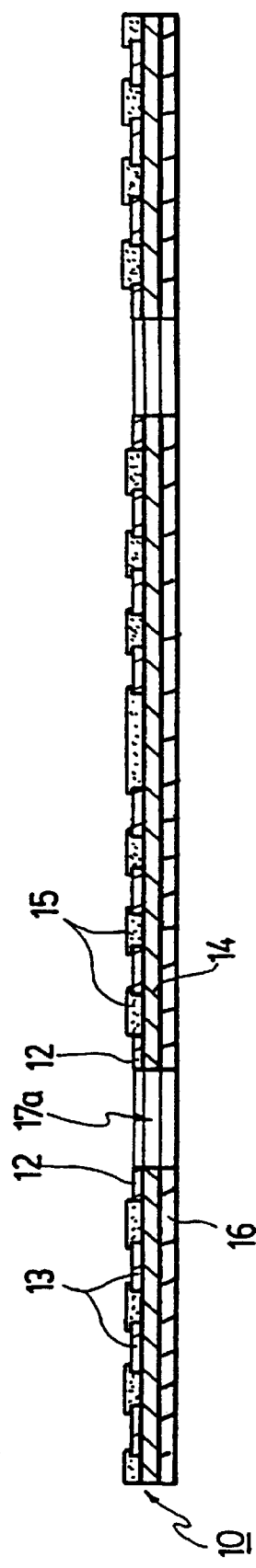
Figure 5C:
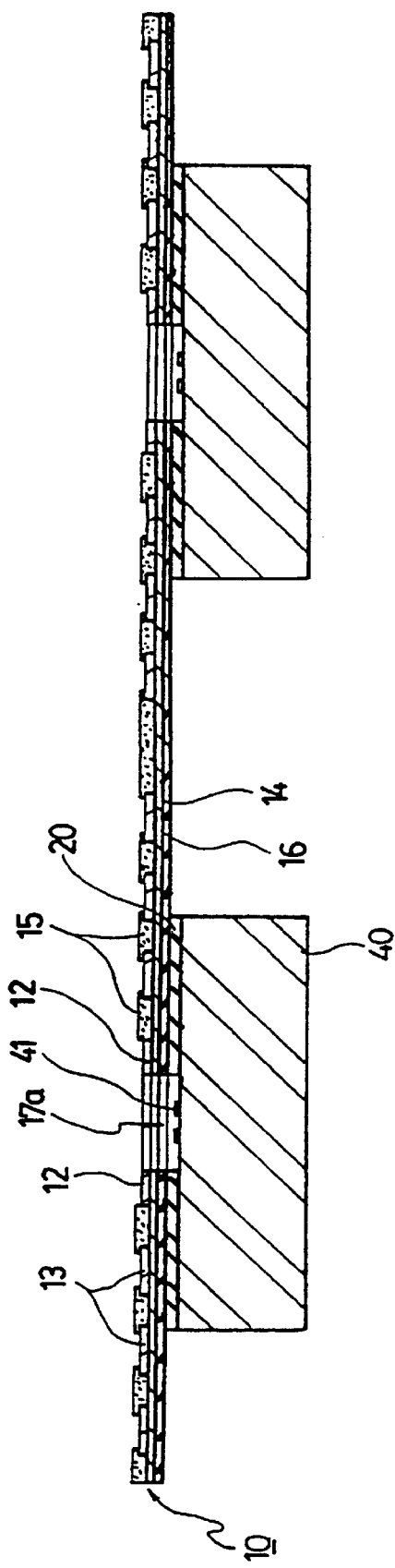

Thereafter, a substrate preparation step is performed so as to provide a desired substrate 10 as shown in FIG. 5B. In this step, the copper film 11a is partially removed from the raw substrate sheet 10a through conventional photo masking and etching processes, thus forming a substrate 10 having a circuit pattern. The above circuit pattern has a plurality of conductive traces 11 individually consisting of a bond finger 12 and a solder ball land 13. An insulating cover coat 15, made of a conventional insulating material, is formed on the substrate 10 at a position except for both the bond fingers 12 and the solder ball lands 13, thus insulating and protecting the circuit pattern. A strip-shaped opening 17a is formed on the substrate 10 at a position corresponding to the signal input/output pads 41 of a chip 40 which is to be attached to the substrate 10.

A part of such a substrate 10, having a wafer shape, is shown in FIG. 6. As shown in FIG. 6, the substrate 10 consists of a plurality of square units which are arranged in a check pattern. Each of the substrate units has a strip-shaped opening 17a at its central portion, with two bond fingers 12 being formed along opposite axial edges of the longitudinal opening 17a. A plurality of solder ball lands 13 are formed on each substrate unit at a position outside the two bond fingers 12, with a linear slot 18 being formed at each edge of each unit of the substrate 10, thus allowing the substrate 10 to be easily cut into the units in a singulation step. In order to allow a plurality of conductive wires 50 to be effectively and firmly bonded to the bond fingers 12, the two bond fingers 12 may be preferably plated with silver (Ag). In addition, it is preferable to plate the top surface of each solder ball land 13 with gold (Au) and/or nickel (Ni). This allows the solder balls 70 to be effectively and firmly welded to the lands 13, respectively.

Thereafter, a chip mounting step is performed. In this step, the top surface of a semiconductor chip 40 is attached to the lower surface of each unit of the substrate 10 using an adhesive layer 20 or a double-faced adhesive tape. In such a case, the pads 41 of the chip 40 are positioned within the opening 17a while being exposed to the outside of the substrate 10.

In the above process of manufacturing the package 1, the wafer is carefully inspected so as to discriminate between defective chips and good chips prior to singulation of the chip units of the wafer from each other through a sawing process, with the good chips being exclusively attached to the substrate 10 while discarding the defective chips. Therefore, it is possible to prevent such defective chips from being attached to the expensive substrate during a package manufacturing process.

Figure 5D:
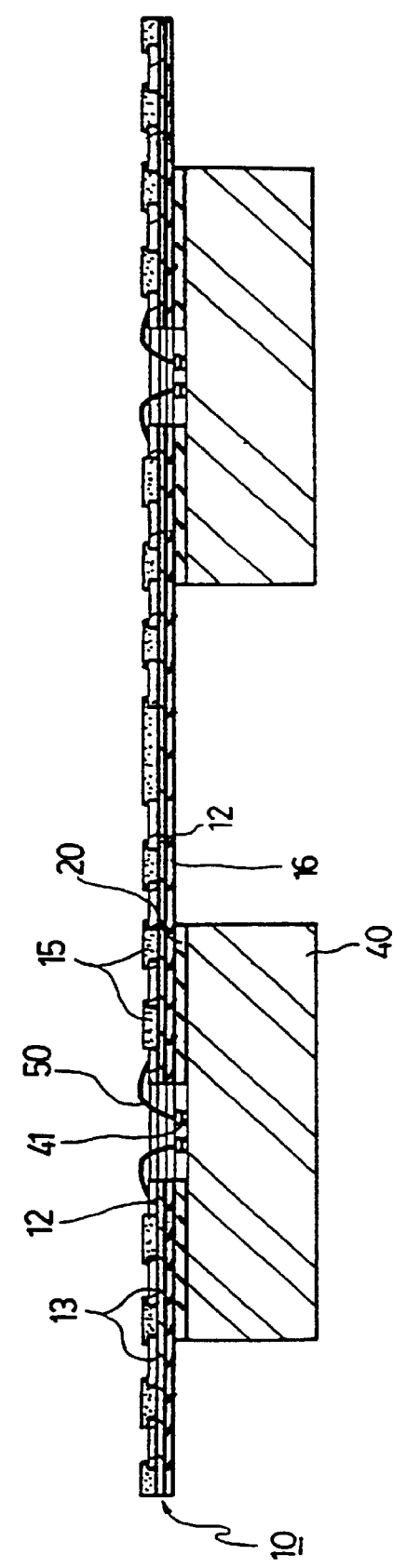

After the chip mounting step, a wire bonding step is performed as shown in FIG. 5D. In the wire bonding step, the pads 41 of the chip 40 are electrically connected to the bond fingers 12 of the stiff substrate 10 through a wire bonding process using a plurality of conductive wires 50, such as gold or aluminum wires.

Figure 5E:
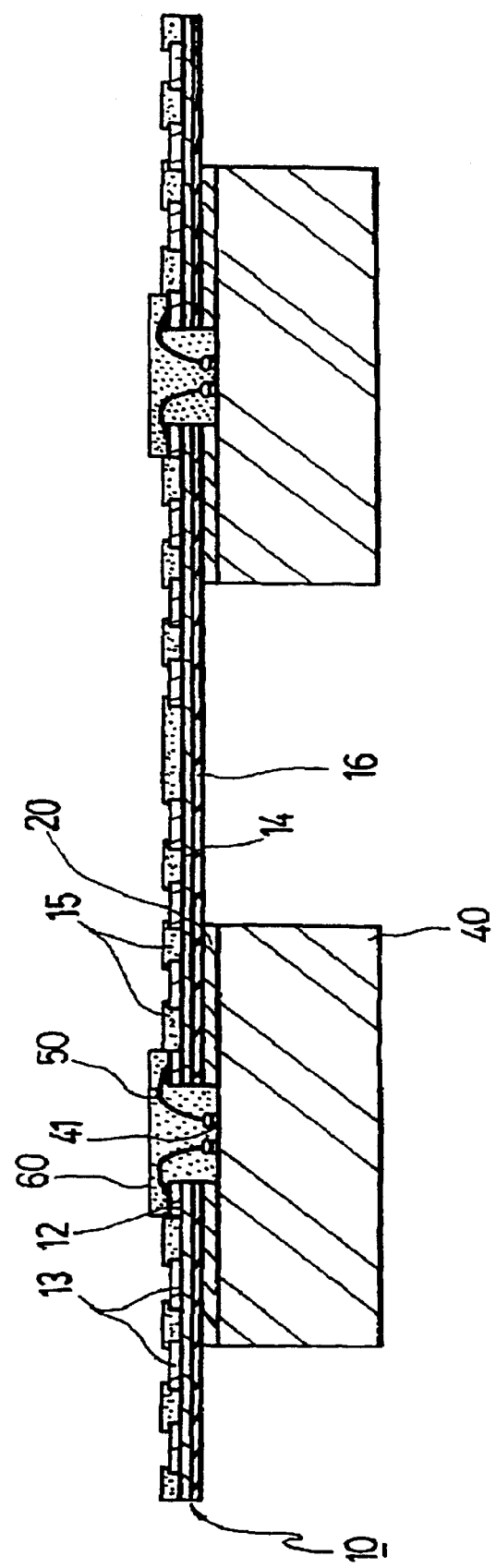

A packaging step is, thereafter, performed so as to form a main packaging part 60 within the opening 17a of the substrate 10 through a molding process as shown in FIG. 5E. The above packaging part 60 protects the bond fingers 12, the conductive wires 50 and the pads 41 from atmospheric environment. In such a case, the packaging part 60 may be formed of a liquid package material or a transfer molding package material. The selection of such package materials is well known to those skilled in the art and further explanation is thus not deemed necessary.

Figure 5F:
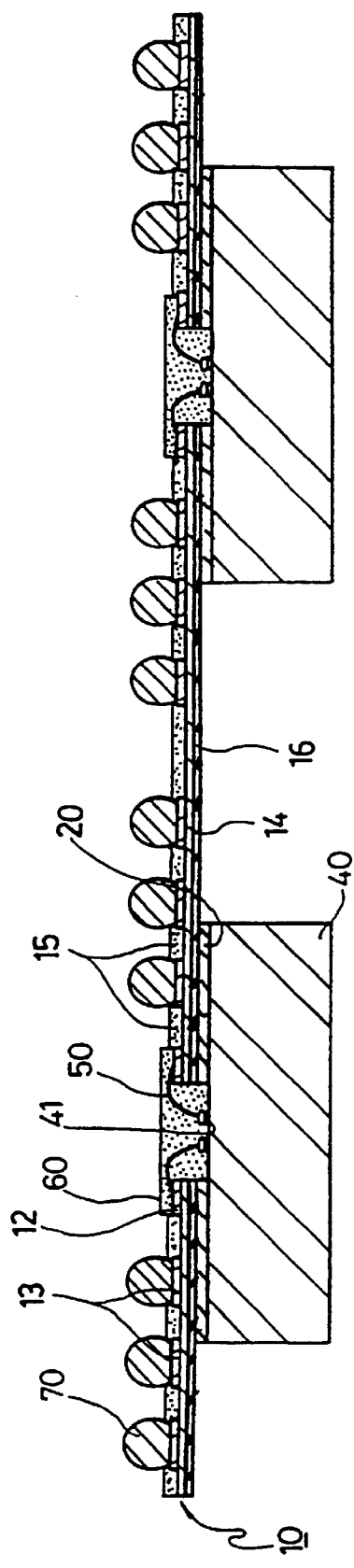

Thereafter, a solder ball 70 is seated on each solder ball land 13 of the substrate 10 prior to being heated in a high temperature heat treating device, such as an oven or a furnace. The solder balls 70, or the signal input/output terminals of the package 1, are welded to the lands 13 as shown in FIG. 5F. This step is so-called a solder ball welding step in the art.

Figure 5G:
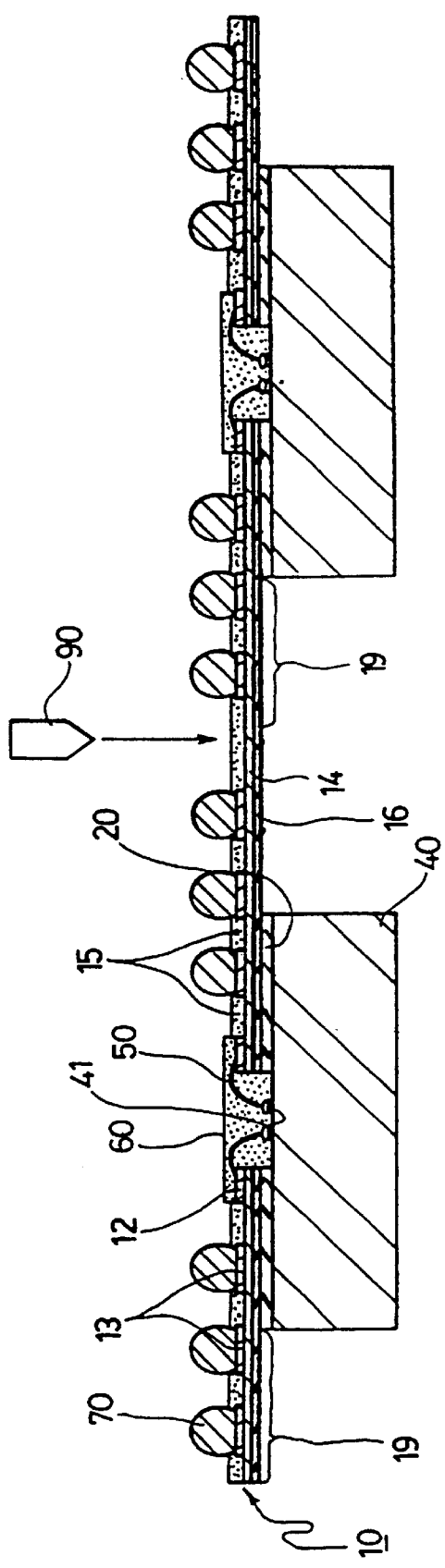

After the solder ball welding step, a singulation step is performed as shown in FIG. 5G. In the singulation step, the stiff substrate 10, integrated with a plurality of chips 40 and forming a plurality of unit packages 1, is divided into the packages 1 or a plurality of package sets using a singulation tool 81, with each package set including two to ten square or strip packages 1.

In accordance with the above-mentioned process of FIGS. 5A to 5G, the wafer is carefully inspected so as to discriminate between the defective chips and the good chips prior to singulation of the chip units of the wafer from each other through a sawing process. The good chips are exclusively attached to the substrate 10 while discarding the defective chips. It is thus possible for the process to prevent such defective chips from being undesirably used with the expensive substrate. This increases the production yield while manufacturing such packages, thus improving the productivity of the packages and reducing the manufacturing cost of the packages.

FIGS. 7A to 7I are cross-sectional side views, showing the process of manufacturing the semiconductor package 1c of the second embodiment of this invention. Of course, it should be understood that the process of manufacturing the semiconductor package 1b of FIG. 2A is equal to that of the package 1c.

Figure 7A:
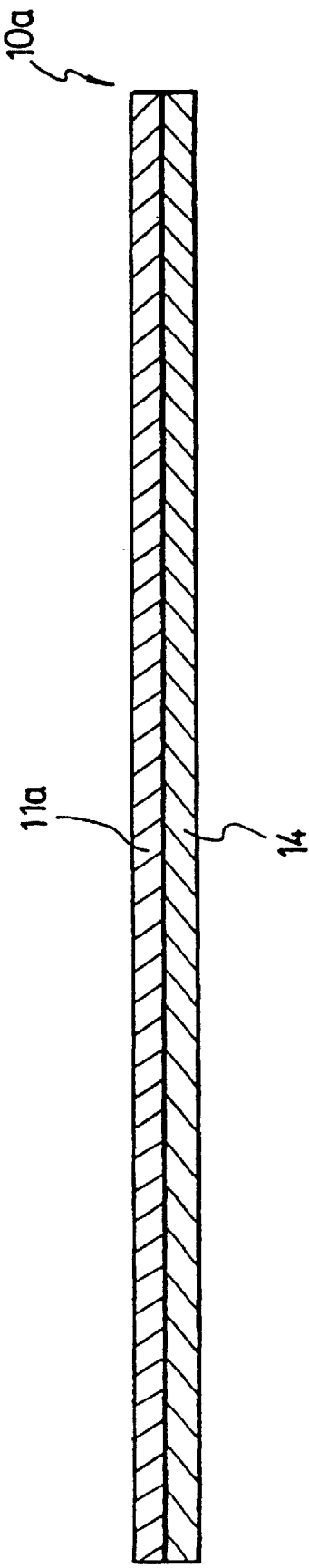
FIGS. 7A to 7I are cross-sectional side views, showing the process of manufacturing a semiconductor package of the second embodiment of this invention.

As shown in FIG. 7A, a raw substrate sheet forming step is primarily performed. In this step, a conductive thin film, preferably a thin copper film 11a, is formed on a strip-shaped or circular-shaped flexible insulating polyimide layer or film 14, having the same size and configuration as that of a conventional wafer, through a sputtering process or an adhesion process, with the adhesion process using an adhesive layer, thus forming a raw substrate sheet 10a.

Figure 7B:
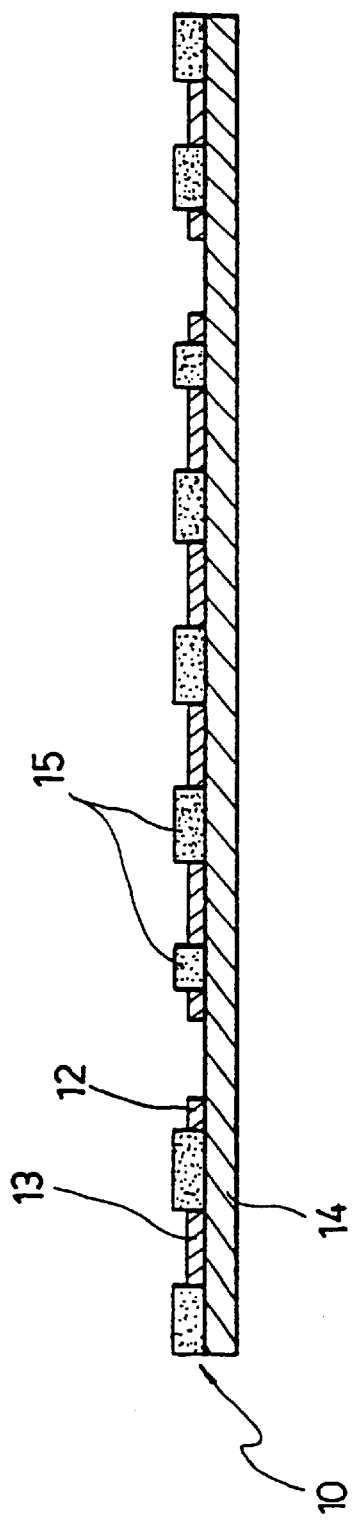

Thereafter, a substrate preparation step is performed so as to provide a desired substrate 10 as shown in FIG. 7B. In this step, the copper film 11a is partially removed from the raw substrate sheet 10a through photo masking and etching processes, thus forming a substrate 10 having a circuit pattern. The above circuit pattern has a plurality of conductive traces 11, individually consisting of a bond finger 12 and a solder ball land 13. An insulating cover coat 15, made of a conventional insulating material, is formed on the substrate 10 at a position except for both the bond fingers 12 and the solder ball lands 13, thus insulating and protecting the circuit pattern. A plurality of strip-shaped openings 17b are formed on the substrate 10 at a position corresponding to the signal input/output pads 41 of a chip 40, with four openings 17a forming a square profile.

A part of such a substrate 10, having a wafer shape, is shown in FIG. 10. As shown in FIG. 10, the substrate 10 consists of a plurality of square units which are arranged in a check pattern. Each of the substrate units has four strip-shaped openings 17b forming a square profile. Two bond fingers 12 are formed along opposite axial edges of each longitudinal opening 17b. A plurality of solder ball lands 13 are formed on each substrate unit at a position outside the bond fingers 12, with a linear slot 18 being formed at each edge of each unit of the substrate 10, thus allowing the substrate 10 to be easily cut into the units in a singulation step.

Figure 7C:
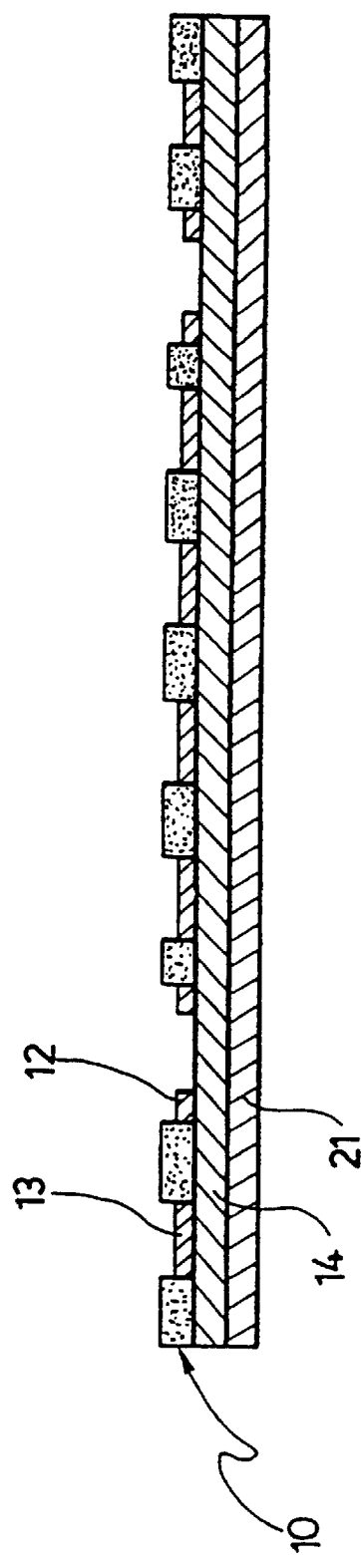
Figure 7D:
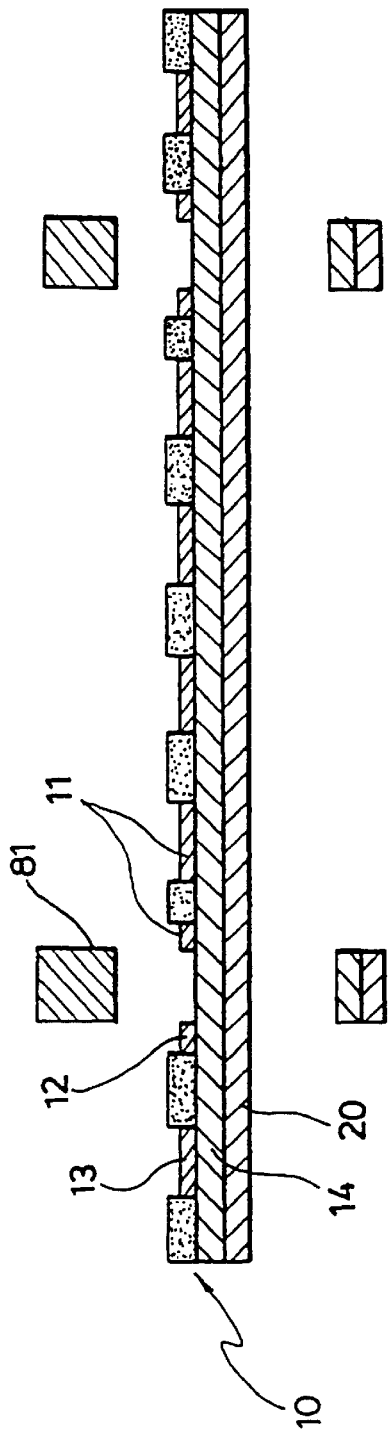

In the above process, each opening 17b may be formed in the substrate 10 using an opening machine 81, such as a punching, drilling, lasering or etching machine, with an adhesive layer 20 or a double-faced adhesive tape being provided on the lower surface of the substrate 10 prior to the opening step as shown in FIGS. 7C and 7D. Alternatively, each opening 17b may be formed on the substrate 10 prior to providing an adhesive layer 20 or a double-faced adhesive tape on the lower surface of the substrate 10. Due to the openings 17b, it is possible to observe an alignment of a chip 40 relative to the substrate 10 using a visual measuring means during a chip mounting step. This effectively and almost completely prevents a misalignment of the chip 40 relative to the substrate 10 during the chip mounting step. The above openings 17b also allow both a wire bonding step and a packaging step to be easily performed.

Of course, it should be understood that the raw substrate sheet 10a for the package 1c according to the second embodiment may be formed as a stiff structure produced by orderly forming a stiff core layer 16, a flexible polyimide layer 14, a conductive thin film 11a and a cover coat 15 from the bottom to the top of the sheet 10a in the same manner as that described for the process of FIGS. 5A to 5G. As a further alternative, the raw substrate sheet 10a may be formed as a flexible structure wherein only the cover coat 15 is formed on a conductive thin film 11a. However, the third method is not shown in the accompanying drawings.

Figure 7E:
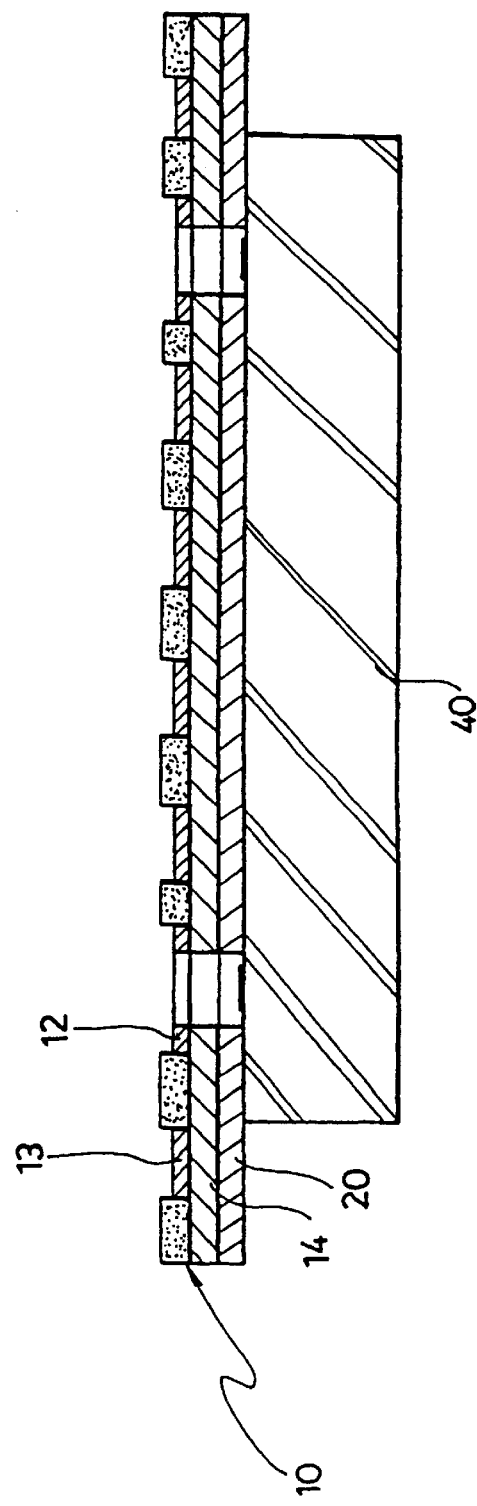
Figure 7F:
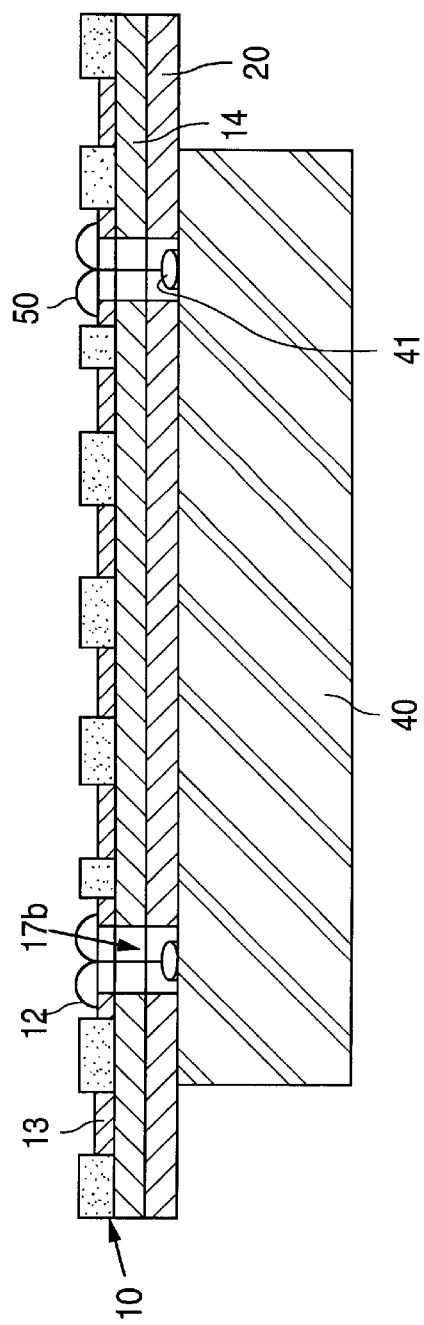
Figure 7G:
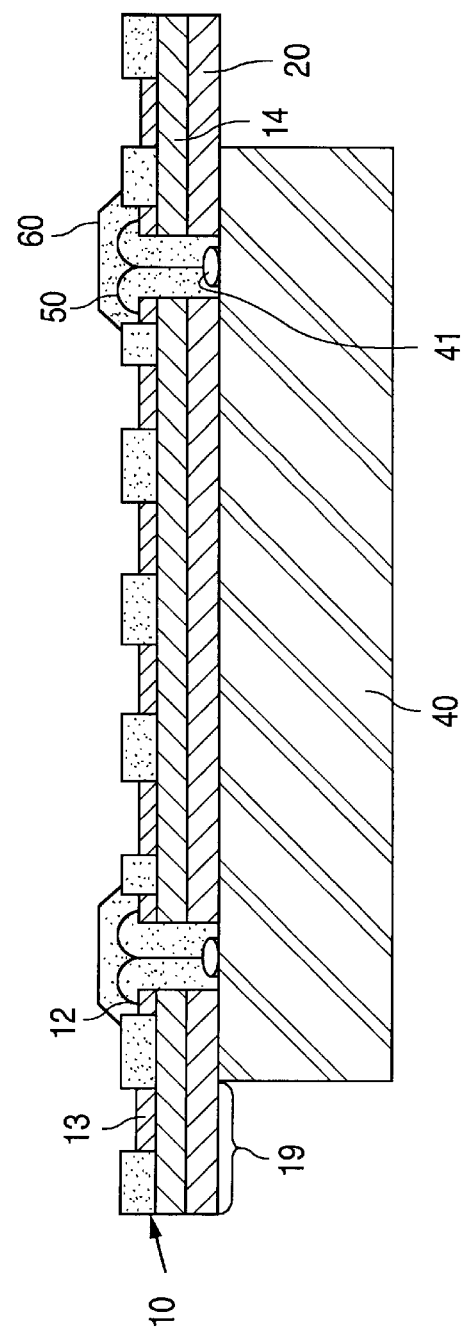

After forming the openings 17b on the substrate 10, a chip mounting step of FIG. 7E, a wire bonding step of FIG. 7F, a primary packaging step of FIG. 7G, a solder ball welding step, and a singulation step are orderly performed in the same manner as that described for the process of FIGS. 5A to 5G. Further explanation for the above steps is thus not deemed necessary.

Figure 7H:
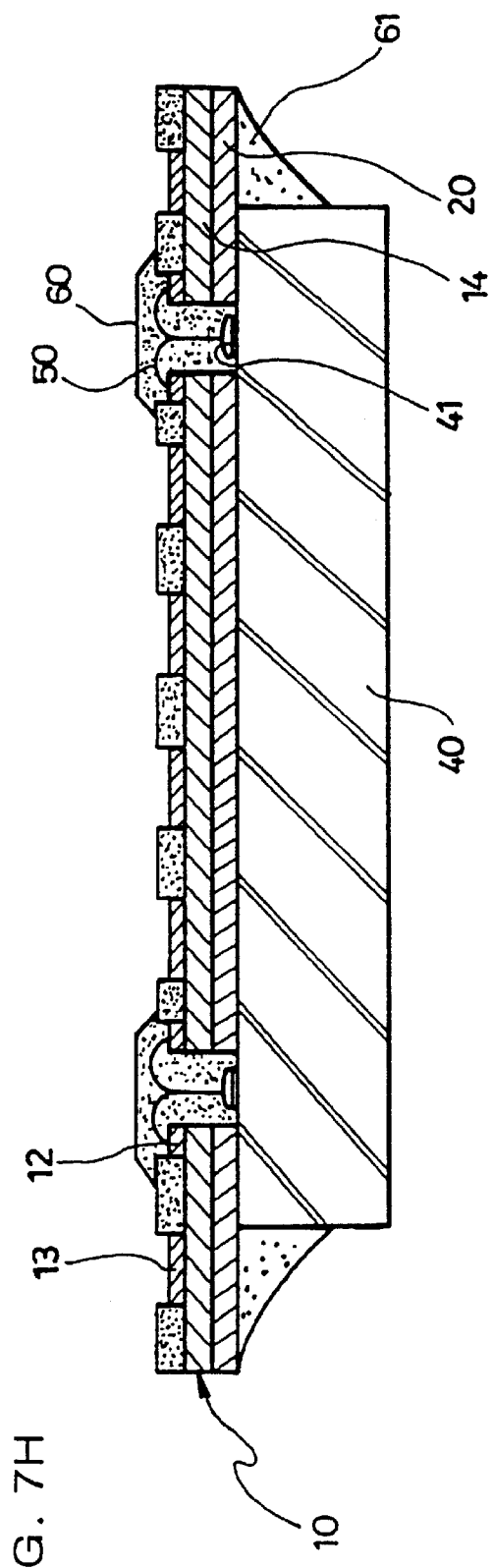
Figure 7I:
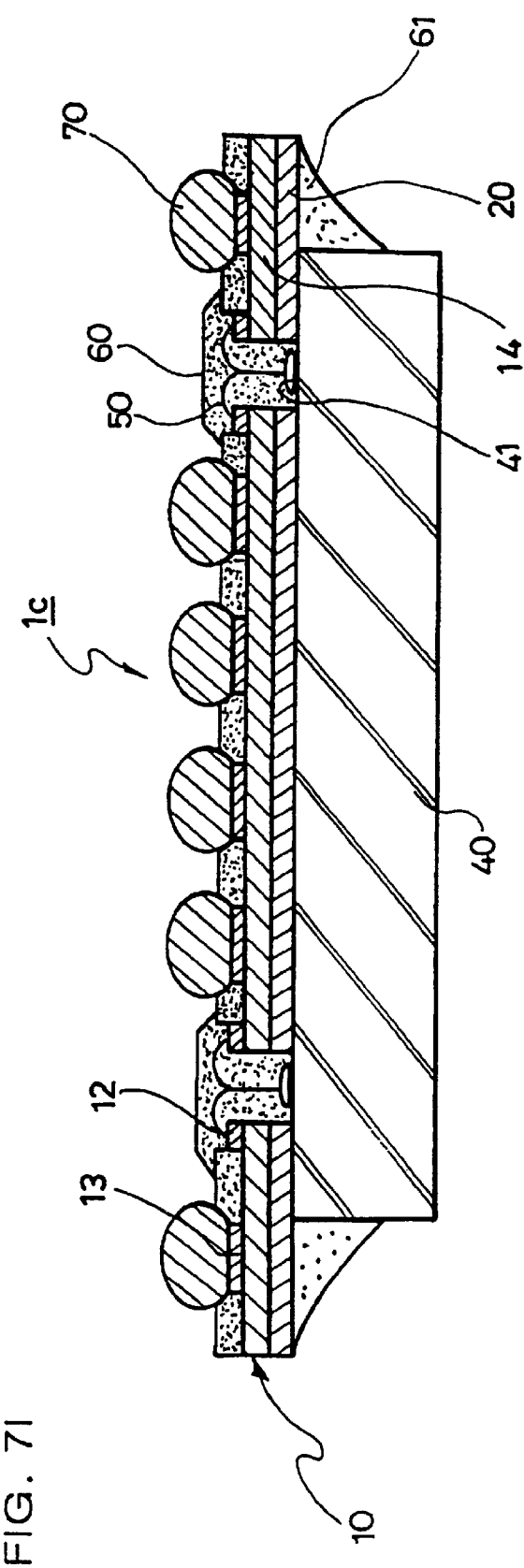

However, the process of manufacturing the package 1c of the second embodiment also has a secondary packaging step of FIG. 7H different from the process of producing the package 1. The objective of the secondary packaging step of FIG. 7H is to form the additional packaging part 61 on the lower surface of the exterior area 19 of the substrate 10 through a molding process, thus stiffening the area 19. Such an additional packaging part 61 is particularly designed to support and stiffen the exterior area 19 of a flexible substrate 10.

In accordance with the process of FIGS. 7A to 7I, the wafer is carefully inspected so as to discriminate between defective chips and good chips prior to singulation of the chip units of the wafer from each other through a sawing process. The good chips are exclusively attached to the substrate 10 while discarding the defective chips. It is thus possible for the process to prevent such defective chips from being undesirably used with the expensive substrate. This increases the production yield while manufacturing such packages, thus improving the productivity of the packages and reducing the manufacturing cost of the packages. In addition, the exterior area of the substrate is firmly supported and stiffened by the additional packaging part 61, and so the package of the second embodiment effectively carries an increased number of solder balls, or the signal input/output terminals of the package.

FIGS. 8A to 8I and FIGS. 9A to 9H are cross-sectional side views and/or perspective views, showing the processes of manufacturing the semiconductor package 1d and 1e of the third embodiment of this invention. In the package 1d produced by the process of FIGS. 8A to 8I, both the pads 41 of the chip 40 and the opening 17a of the substrate 10 are formed at the central portion of the package 1d while forming a strip-shaped profile in the same manner as that described for the process of FIGS. 5A to 5G. Such a substrate 10 of the package 1d is shown in FIG. 6. On the other hand, in the package 1e produced by the process of FIGS. 9A to 9H, the pads 41 of the chip 40 are arranged in a square arrangement, while four openings 17a are formed on the substrate 10 in a way such that they form a square profile in the same manner as that described for the process of FIGS. 7A to 7I. Such a substrate 10 of the package 1e is shown in FIG. 10. However, it should be understood that the two packages 1d and 1e of the third embodiment are produced through practically the same process, of which the general steps remain the same as that described for the process of FIGS. 7A to 7I, but some steps are altered as will be described hereinbelow.

Figure 8A:
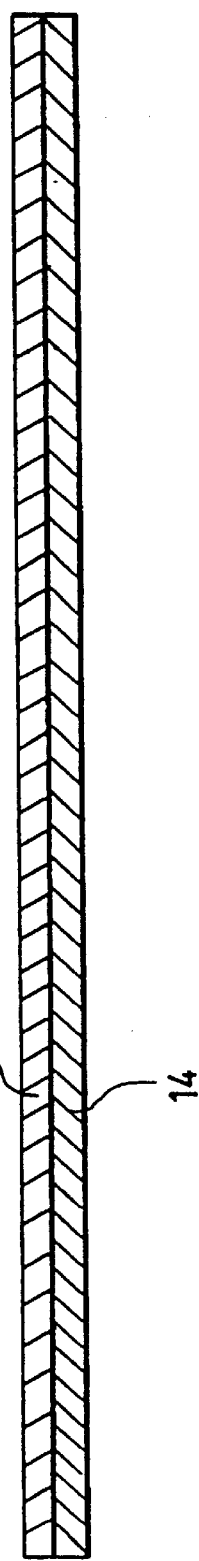
Figure 8B:
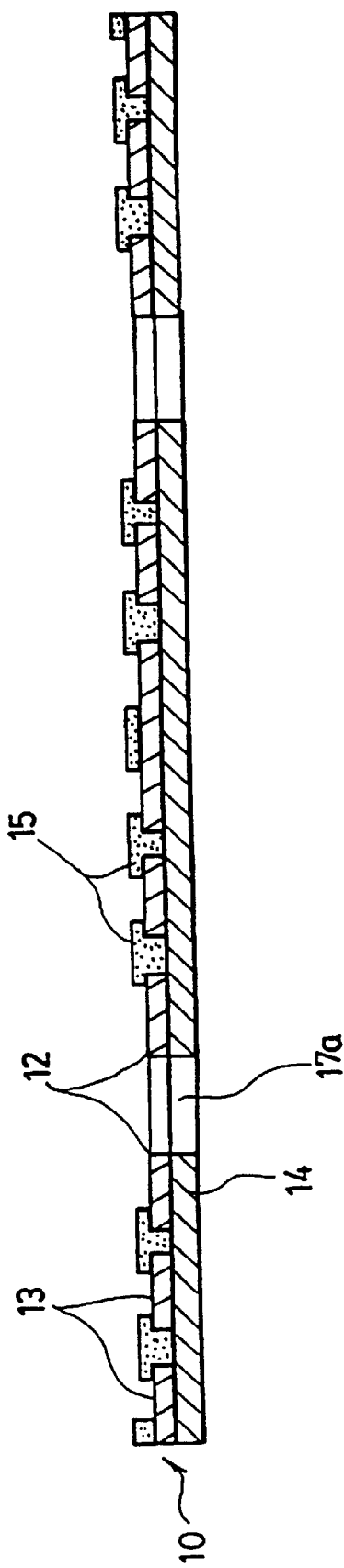
Figure 9A:
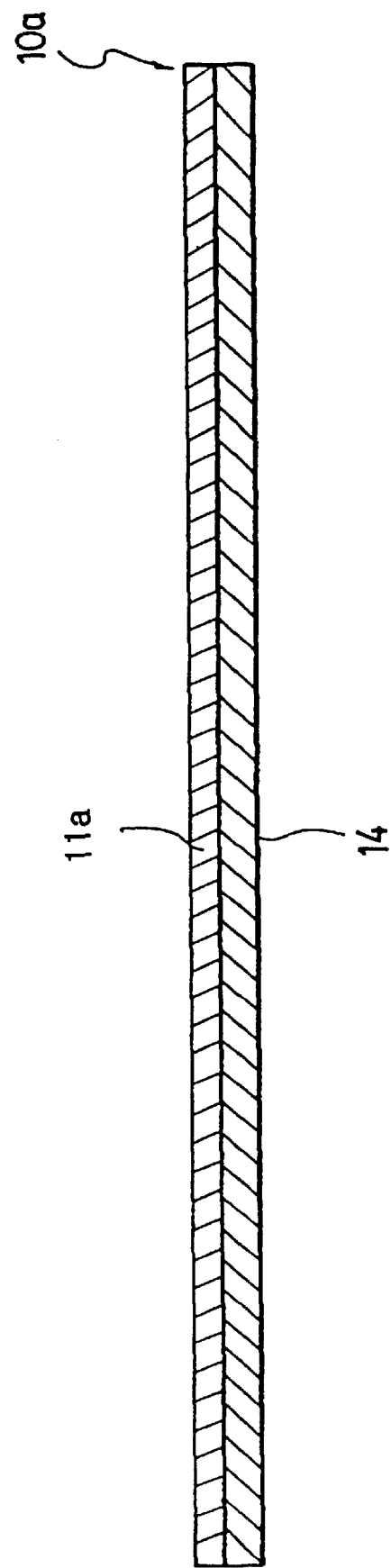

That is, FIGS. 8A and 9A individually show a step of producing a raw substrate sheet 10a for an objective package 1d, 1e. This step is equal to the step of FIG. 7A, and further explanation is thus not deemed necessary. On the other hand, FIGS. 8B and 9B individually show a substrate preparation step wherein a thin copper film 11a is partially removed from the raw substrate sheet 10a through photo masking and etching processes prior to forming a cover coat 15 on the sheet 10a, thus forming a substrate 10 having a circuit pattern. This substrate preparation step is equal to the step of FIG. 7B and further explanation is thus not deemed necessary. In the substrate preparation step, the adhesive layers 20 and 22 may be formed on the substrate 10 before or after the opening 17a, 17b is formed on the substrate 10. When a double-faced adhesive tape is used as an adhesive layer 20, 22, it is preferable to form the opening 17a, 17b on the substrate 10 after the tape is attached to the substrate 10. Meanwhile, when the adhesive layer 20, 22 is formed of an adhesive agent, it is preferable to form the opening 17a, 17b on the substrate 10 before the layer 20, 22 is formed on the-substrate 10 since it improves work efficiency while performing the process. The material and configuration of the stiffener 30 is the same as that described above. In addition, the package 1d, 1e has a cavity 31 between the chip 40 and the stiffener 30. However, it should be understood that the package 1d, 1e may be designed in that the stiffener 30 is brought into direct contact with the chip 40 while being free from such a cavity 31.

Figure 8C:
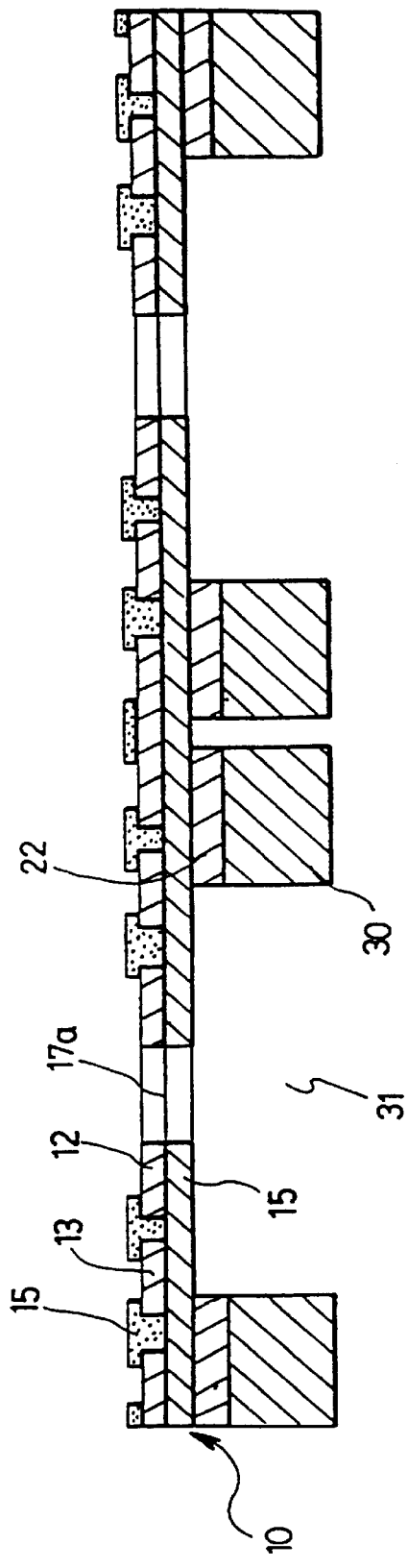
Figure 8D:
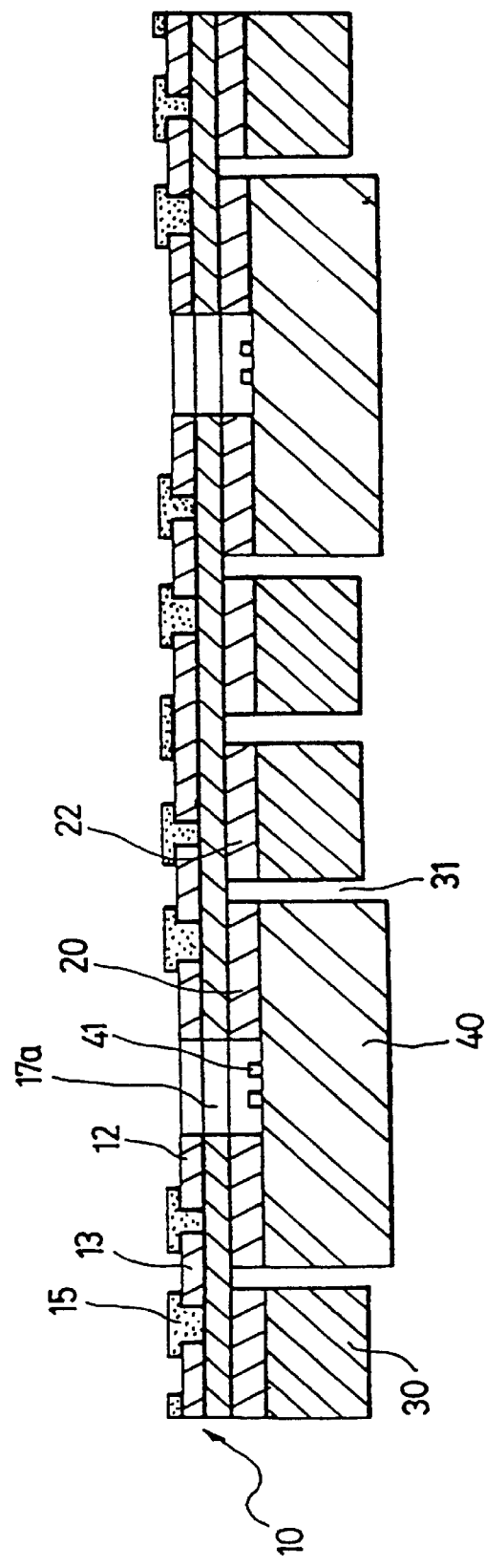
Figure 9D:
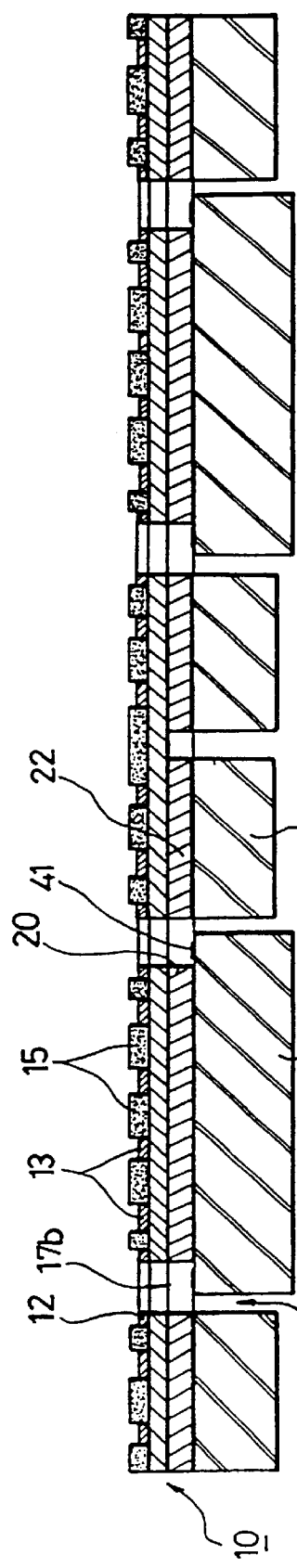

FIGS. 8C and 9C individually show a step of mounting the stiffener 30 to the lower surface of the exterior area 19 of the substrate 10 using the adhesive layer 22. FIGS. 8D and 9D individually show a step of mounting a chip 40 to the lower surface of the substrate 10 using the adhesive-layer 20. In the process of manufacturing the package 1d, 1e of the third embodiment, the order of the steps of mounting the stiffener 30 and the chip 40 to the substrate 10 may be altered without affecting the functioning of this invention. That is, the stiffener mounting step may be performed prior to the chip mounting step, or the chip mounting step may be performed prior to the stiffener mounting step.

Figure 8G:
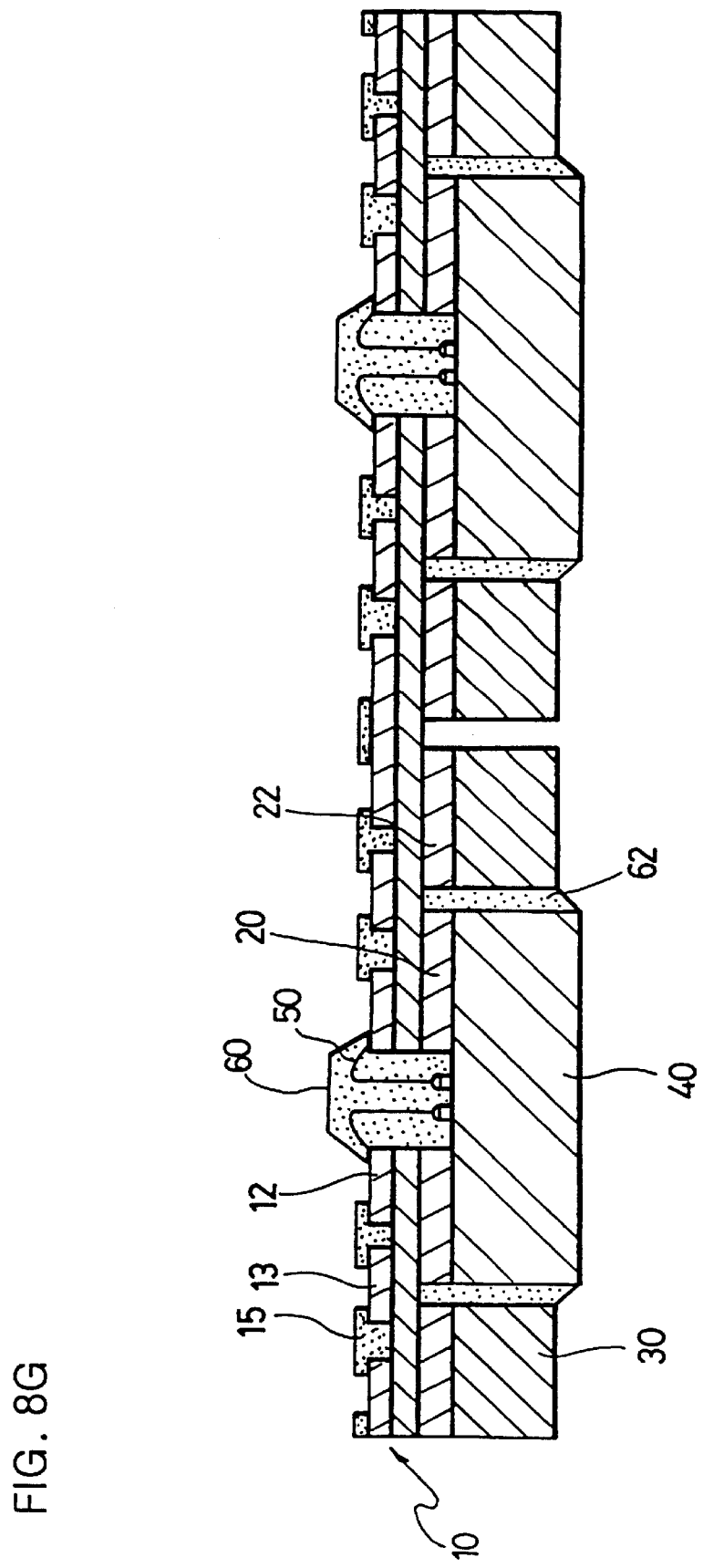
Figure 9E:
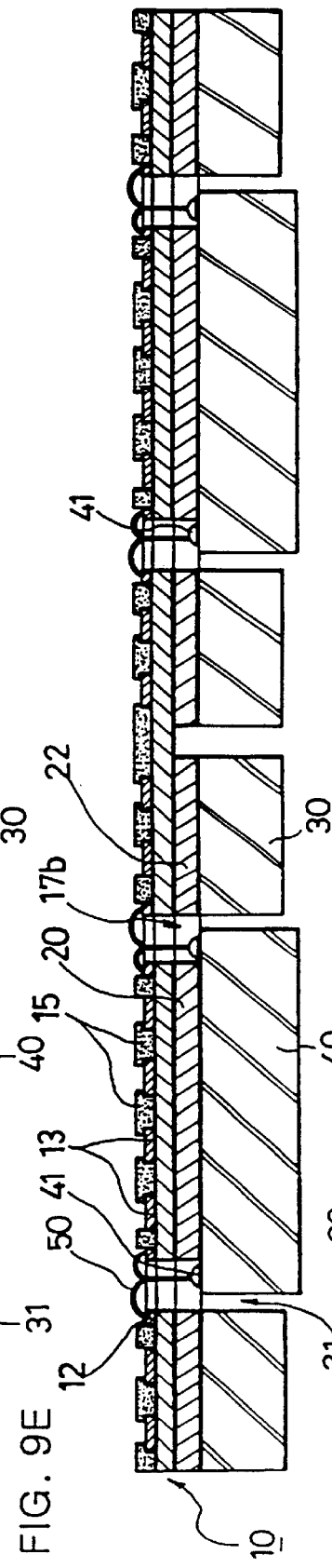
Figure 9F:
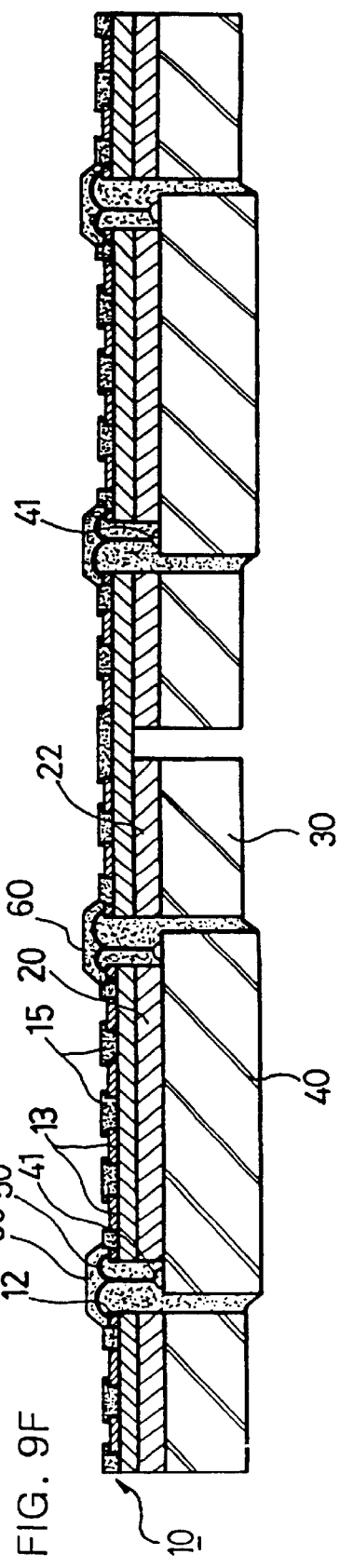

FIGS. 8E and 9E individually show a wire bonding step, while FIGS. 8F, 8G and 9F individually show a packaging step. That is, FIG. 8F shows a primary packaging step of forming the main packaging part 60 which protects the conductive wires 50, the bond fingers 12 and the pads 41. On the other hand, FIG. 8G shows a secondary packaging step of forming the additional packaging part 62 which fills the cavity 31 between the stiffener 30 and the chip 40. The order of the two packaging steps may be altered without affecting the functioning of this invention. In the packaging step of FIG. 9F, the packaging part 60 may be formed as an integrated part through one molding process since the opening 17b of the substrate 10 communicates with the cavity 31 formed between the stiffener 30 and the chip 40.

Figure 8H:
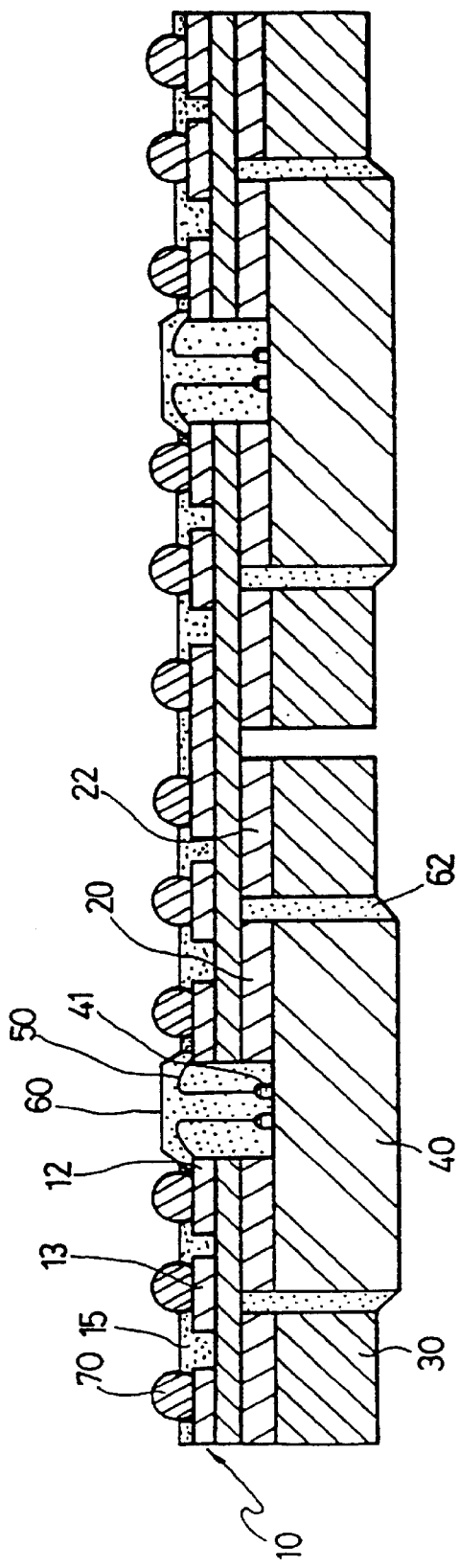
Figure 9G:
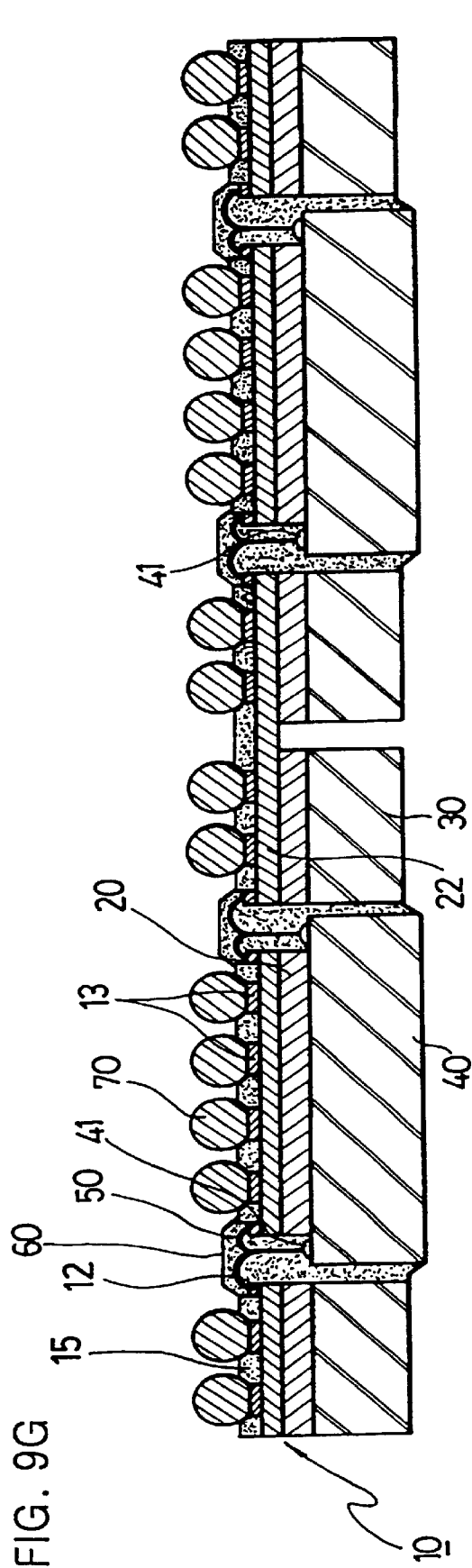

FIGS. 8H and 9G individually show a solder ball welding step which is the same as that described for the processes of producing the packages of the primary and second embodiment. Further explanation for the solder ball welding step is thus not deemed necessary.

Figure 8I:
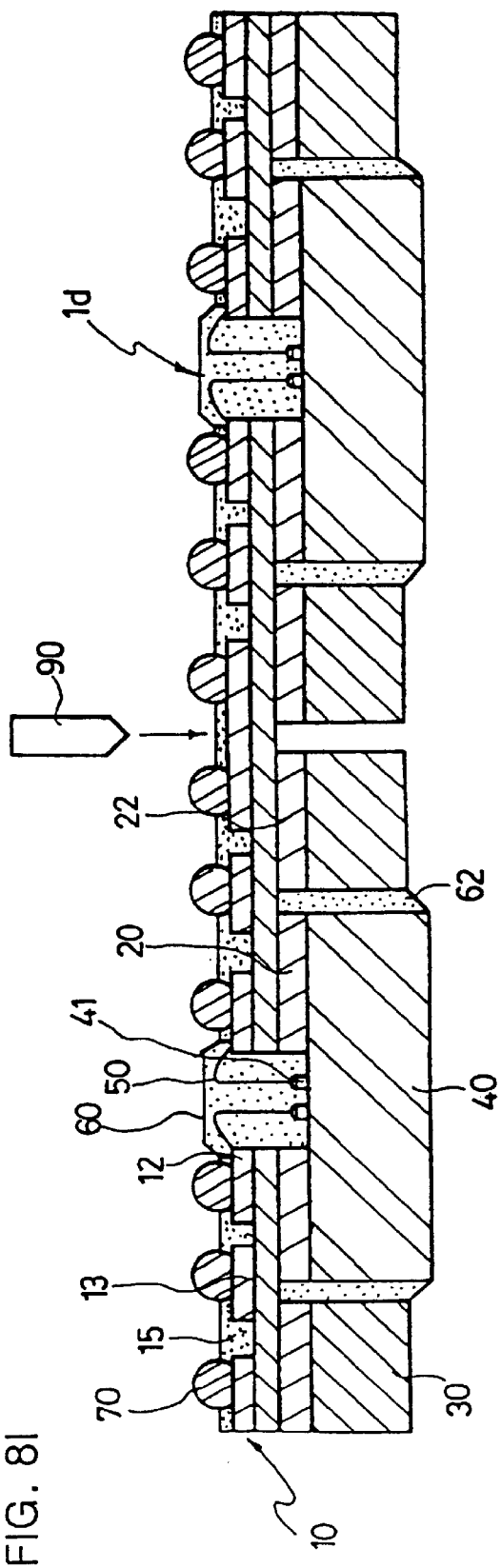
Figure 9H:
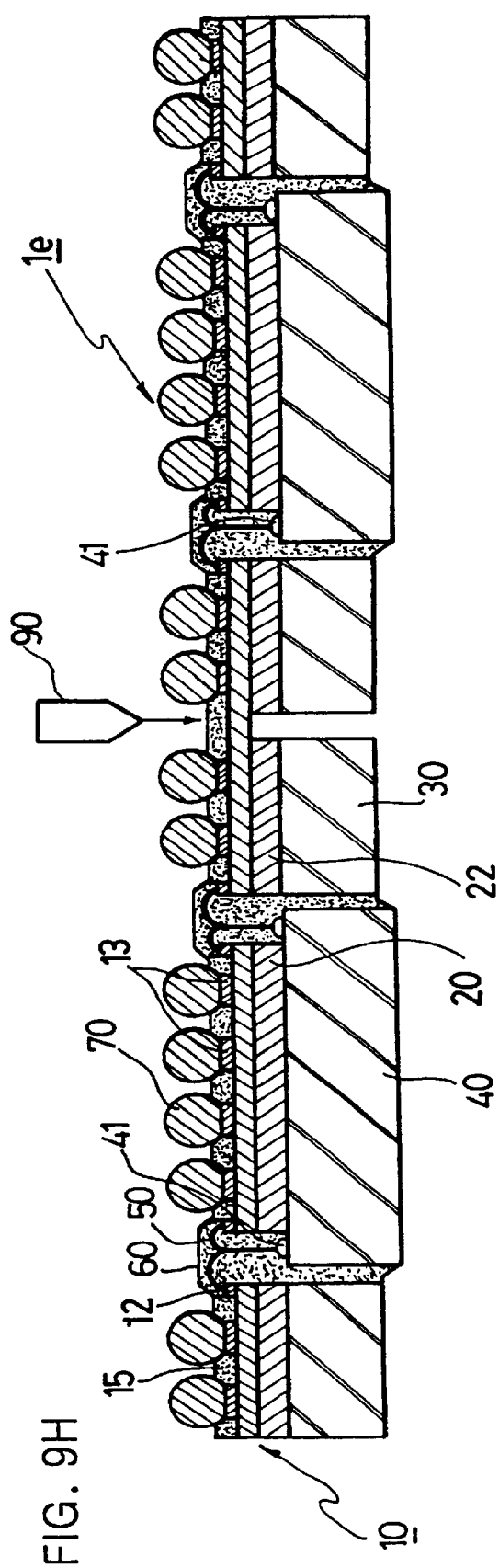

FIGS. 8I and 9H individually show a singulation step wherein the wafer-shaped or strip-shaped substrate 10, integrated with a plurality of chips 40 and forming a plurality of unit packages 1d, 1e, is divided into the packages 1d, 1e using a singulation tool 90. This singulation step is performed in the same manner as that described above.

On the other hand, the packages 1f, 1g, 1h, 1i, 1j and 1k according to the fourth embodiment of this invention are produced in the same manner as that described for the processes of FIGS. 8A to 8I and FIGS. 9A to 9H, but a step of attaching a lid to both a chip and a stiffener is added to the process of making each of the packages 1f, 1g, 1h, 1i, 1j and 1k as will be described hereinbelow.

The above lid 80, which is attached to the lower surface of both the chip 40 and the stiffener 30 using an adhesive layer 23, 24 or 25, 26 may have a rectangular or square rim 82 on its outside top surface. Alternatively, the lid 80 may have a flat configuration. As a further alternative, the lid 80 may have a box shape with a sidewall 83 being formed along the edge. In addition, the material of the above lid 80 is preferably made of a highly conductive material as described above.

In the present invention, the lid mounting step may be performed after both the stiffener mounting step and the chip mounting step. Alternatively, the lid mounting step may be performed as an intermediate step between the stiffener mounting step, the chip mounting step and the singulation step without affecting the functioning of this invention.

In each of the processes of FIGS. 8A to 8I and FIGS. 9A to 9H, the wafer is carefully inspected so as to discriminate between defective chips and good chips prior to singulation of the chip units of the wafer from each other through a sawing process. The good chips are exclusively attached to a substrate while discarding the defective chips. It is thus possible for the process to prevent such defective chips from being undesirably used with the expensive substrate. This increases the production yield while manufacturing such packages, thus improving the productivity of the packages and reducing the manufacturing cost of the packages. In addition, the exterior area of the substrate is firmly supported and stiffened by the stiffener, and so each of the packages of the third and fourth embodiments effectively carries an increased number of solder balls, or the signal input/output terminals of the package. Another advantage of the package of the third or fourth embodiment resides in that it has an improved heat dissipating effect, thus effectively protecting its semiconductor chip.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor package comprising:
    a semiconductor chip having a first surface and a plurality of conductive pads on the first surface;
    a substrate having a first surface and an opposite second surface having a plurality of conductive metallizations thereon, wherein the chip is mounted on the first surface of the substrate, an exterior portion of the substrate extends outside an edge of the first surface of said chip, and said substrate has an opening juxtaposed with the pads;
    a plurality of conductors, wherein each conductor is between a pad of the chip and a metallization and extends through the opening;
    a hardened first packaging material in said opening, said first packaging material covering the pads and conductors;
    a support for said exterior portion of the substrate; and
    a plurality of solder balls, wherein each solder ball is on a metallization of the second surface of the substrate, and a plurality of said solder balls are arranged on the exterior portion of the second surface of the substrate.

2. The package of claim 1, wherein said substrate is flexible.

3. The package of claim 1, wherein said substrate comprises a polyimide layer or a epoxy glass layer.

4. The package of claim 1, wherein said substrate comprises:
    a flexible layer having a first surface and an opposite second surface, wherein said metallizations are juxtaposed with a first surface of said flexible layer; and
    a stiff layer between the second surface of said flexible layer and the first surface of the chip, said stiff layer forming said support.

5. The package of claim 4, wherein said flexible layer is a polyimide layer, and said stiff layer is a thin metal layer or a glass epoxy layer.

6. The package of claim 1, wherein said pads are arranged on a central portion of the chip.

7. The package of claim 6, wherein said substrate is flexible.

8. The package of claim 6, wherein said substrate comprises:
   a flexible layer having a first surface and an opposite second surface, wherein said metallizations are juxtaposed with a first surface of said flexible layer; and
   a stiff layer between the second surface of said flexible layer and the first surface of the chip, said stiff layer forming said support.

9. The package of claim 6, wherein said support is adjacent to the exterior portion of the first surface of the substrate and the sidewall of said chip.

10. The package of claim 9, wherein said support is spaced apart from said adjacent sidewall of the chip.

11. The package of claim 10, further comprising a hardened second packaging material between the support and the sidewall of the chip.

12. The package of claim 9, wherein said support is in contact with the adjacent sidewall of the chip.

13. The package of claim 1, wherein said pads are arranged along at least two opposite edges of four edges of said first surface of chip.

14. The package of claim 13, wherein said substrate is flexible.

15. The package of claim 13, wherein said substrate comprises:
   a flexible layer having a first surface and an opposite second surface, wherein said metallizations are juxtaposed with a first surface of said flexible layer; and
   a stiff layer between the second surface of said flexible layer and the first surface of the chip, said stiff layer forming said support.

16. The package of claim 14, wherein said support is adjacent to the exterior portion of the first surface of the substrate and the sidewall of said chip.

17. The package of claim 16, wherein said support is spaced apart from said adjacent sidewall of the chip.

18. The package of claim 17, wherein said first packaging material is between the support and the sidewall of the chip.

19. The package of claim 16, wherein said support is in contact with the adjacent sidewall of the chip.

20. The package of claim 9, wherein the support is formed of a resin material.

21. The package of claim 9, wherein said support is formed of a material selected from the group of copper, aluminum, copper and aluminum alloy, ceramic, and a resin; and
   said support has a cross-sectional rectangular profile and a ring or longitudinal rod shape.

22. The package of claim 9, wherein said chip has a second surface opposite first surface; and
   further comprising a lid on the second surface of the chip and on the support.

23. The package of claim 22, wherein said lid is made of a material selected from the group of copper, aluminum, copper and aluminum alloy, a metal powder dispersed resin, and resin.

24. The package of claim 22, wherein said lid has a sidewall parallel to a sidewall of said chip.

25. The package of claim 1, further comprising an adhesive layer between the first surface of the substrate and the chip, and between the first surface of the substrate and the support.

26. A semiconductor package comprising:
   a semiconductor chip having a first surface and a plurality of conductive pads on the first surface;
   a substrate having a first surface and an opposite second surface having a plurality of conductive metallizations thereon, wherein the chip is mounted on first surface of the substrate, an exterior portion of the substrate extends outside an edge of the first surface of said chip, and said substrate has an opening juxtaposed with the pads;
   a means for supporting the exterior portion of the substrate;
   a plurality of conductors, wherein each conductor is between a pad of the chip and a metallization;
   a hardened first packaging material in said opening, said first packaging material covering the pads and conductors; and
   a plurality of solder balls, wherein each solder ball is conductively connected with a metallization of the second surface of the substrate, and a plurality of said solder balls are arranged on the exterior portion of the second surface of the substrate.

27. A method of making semiconductor packages, the method comprising:
   preparing a substrate having a first surface, an opposite second surface, and a plurality of package sites, wherein each package site comprises a plurality of metallizations on the second surface of the substrate and one or more first openings between the first and second surfaces;
   providing a plurality of semiconductor chips each having a first surface and a plurality of conductive pads on said first surface;
   mounting a semiconductor chip adjacent the first surface of each package site such that the pads are juxtaposed with one or more openings of the package site, and an exterior portion of the substrate of the package site extends beyond an edge of the first surface of the chip;
   conductively connecting each pad of each chip to a metallization of the respective package site through a first opening;
   applying a packaging material within the one or more first openings of each package site so as to cover the pads;
   forming a support at each package site for the exterior portion of the substrate;
   forming solder balls at each package site on the metallizations of the second surface of the substrate such that a plurality of solder balls are arranged on the exterior portion of the substrate of the respective site; and
   separating the package sites so as to form individual semiconductor packages.

28. The method of claim 27, wherein the pads of each chip are arranged on a central portion of the first surface of the chip.

29. The method of claim 28, wherein preparing said substrate comprises a flexible layer and a stiff layer, said stiff layer forming said support.

30. The method of claim 27, wherein each support is formed adjacent to the exterior portion of the first surface of the substrate of each package site and adjacent to the sidewall of the respective chip.

31. The method of claim 30, wherein each support is formed spaced apart from a sidewall of the respective chip of each package site.

32. The method of claim 31, further comprising applying a packaging material between the sidewall of each chip and the support of the respective package site.

33. The method according to claim 27, wherein the pads of each chip are arranged adjacent to at least one edge of the first surface of the chip.

34. The method according to claim 33, wherein preparing said substrate comprises a flexible layer and a stiff layer, said stiff layer forming said support.

35. The method of claim 34, wherein each support is formed adjacent to the exterior portion of the first surface of the substrate of each package site and adjacent to the sidewall of the respective chip.

36. The method of claim 35, wherein each support is formed spaced apart from a sidewall of the respective chip of each package site.

37. The method of claim 36, further comprising applying an packaging material between the sidewall of each chip and the support of the respective package site.

38. The method of claim 27, further comprising:

inspecting the chips of a wafer according to a standard;

separating the chips of the wafer; and mounting only the chips that meet said standard.

39. The method of claim 27, further comprising attaching the chips to their respective package sites using a double-faced adhesive tape or a viscous adhesive.

40. The method according to claim 27 wherein each said support is formed of a material selected from the group of copper, aluminum, copper and aluminum alloy, ceramic and a resin; and each said support is formed so as to have having a rectangular profile and a ring or longitudinal rod shape.

41. The method of claim 27, wherein each said chip has a second surface opposite the first surface of the chip; and further comprising mounting a lid on the second surface of the chip and on the support of each package site.

42. The method of claim 41, wherein said each lid is mounted so that a member of the lid is parallel to a sidewall of the chip of the respective package site.

43. The method of claim 27, wherein said substrate has a wafer-shaped or strip-shaped configuration.

* * * * *